United States Patent
Becker et al.

(10) Patent No.: US 7,638,594 B2
(45) Date of Patent: *Dec. 29, 2009

(54) CONJUGATED POLYMERS CONTAINING SPIROBIFLUORENE UNITS AND THE USE THEREOF

(75) Inventors: Heinrich Becker, Eppstein (DE); Kevin Treacher, Northwich (GB); Hubert Spreitzer, Viernheim (DE); Aurelie Falcou, Frankfurt (DE); Philipp Stoessel, Frankfurt (DE); Arne Buesing, Frankfurt (DE); Amir Parham, Frankfurt (DE); Bernd Schröder, Villmar-Weyer (DE)

(73) Assignee: Merck Patent GmbH, Darmstadt (DE)

( * ) Notice: Subject to any disclaimer, the term of this patent is extended or adjusted under 35 U.S.C. 154(b) by 25 days.

This patent is subject to a terminal disclaimer.

(21) Appl. No.: 11/828,060

(22) Filed: Jul. 25, 2007

(65) Prior Publication Data

US 2007/0265473 A1 Nov. 15, 2007

Related U.S. Application Data

(62) Division of application No. 10/488,625, filed as application No. PCT/EP02/09628 on Aug. 29, 2002, now Pat. No. 7,323,533.

(30) Foreign Application Priority Data

Sep. 4, 2001 (DE) ................................. 101 43 353

(51) Int. Cl.
  *C08G 73/06* (2006.01)
  *C08G 61/02* (2006.01)
  *C08G 61/12* (2006.01)
(52) U.S. Cl. .................... 528/423; 528/86; 528/397; 528/422; 428/690; 428/917; 252/582
(58) Field of Classification Search ................ 528/423, 528/422, 86, 397; 428/690, 917; 252/582
  See application file for complete search history.

(56) References Cited

U.S. PATENT DOCUMENTS

| 5,621,131 A | 4/1997 | Kreuder et al. |
| 5,763,636 A | 6/1998 | Kreuder et al. |
| 6,353,083 B1 | 3/2002 | Inbasekaran et al. |

FOREIGN PATENT DOCUMENTS

| EP | 0894107 | 5/1999 |
| WO | WO-00/46321 | 10/2000 |
| WO | WO-02/077060 | 10/2000 |

OTHER PUBLICATIONS

Meerholz et al., Polymer materials that can be structured, method for producing the same and their use for LED's, Feb. 7, 2002, Covion Organic Semiconductors GmbH, Germany, Chem Abstract 136: 167820.

*Primary Examiner*—Duc Truong
(74) *Attorney, Agent, or Firm*—Connolly Bove Lodge & Hutz LLP

(57) ABSTRACT

The present invention relates to novel conjugated polymers comprising spirobifluorene units and their use in optoelectronic devices, preferably in, for example, displays based on polymeric organic light-emitting diodes.

7 Claims, No Drawings

CONJUGATED POLYMERS CONTAINING SPIROBIFLUORENE UNITS AND THE USE THEREOF

RELATED APPLICATIONS

This application is a divisional application of U.S. patent application Ser. No. 10/488,625, filed Sep. 10, 2004 now U.S. Pat. No. 7,323,533, which is a national stage application (under 35 U.S.C. § 371) of PCT Application No. PCT/EP02/09628, filed Aug. 29, 2002, which claims benefit of German Application 101 43 353.0, filed Sep. 4, 2001.

The present patent application relates to novel conjugated polymers and their use in optoelectronic devices, preferably in, for example, displays based on polymeric organic light-emitting diodes.

Wide-ranging research on the commercialization of display and lighting elements based on polymeric (organic) light-emitting diodes (PLEDs) has been carried on for about 10 years. This development was achieved by the fundamental developments disclosed in EP 423 283 (WO 90/13148). In contrast to low molecular weight organic light-emitting diodes (OLEDs), which have already been introduced on the market, as demonstrated by the commercially available car radios with an "organic display" from Pioneer, the PLEDs have still to be introduced on the market. Significant improvements are still necessary to make these displays genuinely competitive or superior to the liquid crystal displays (LCDs) which currently dominate the market.

EP-A-0 423 283, EP-A-0 443 861, WO 98/27136, EP-A-1 025 183 and WO 99/24526 disclose polyarylene-vinylene derivatives as conjugated polymeric emitters.

EP-A-0 842 208, WO 99/54385, WO 00/22027, WO 00/22026 and WO 00/46321 disclose polyfluorene derivatives as conjugated polymeric emitters.

EP-A-0 707 020 and EP-A-0 894 107 disclose polyspirobifluorene derivatives as conjugated polymeric emitters.

For the purposes of the present invention, conjugated polymers are polymers which contain mainly $sp^2$-hybridized carbon atoms, which may also be replaced by appropriate heteroatoms, in the main chain. This is equivalent to the alternating presence of double and single bonds in the main chain. "Mainly" means that naturally occurring defects which lead to interruptions to the conjugation do not invalidate the term "conjugated polymers". However, the term does not include polymers which contain relatively large amounts of deliberately introduced nonconjugated segments. Furthermore, for the purposes of the present text, the term conjugated is likewise used when, for example, arylamine units and/or particular heterocycles (i.e. conjugation by N, O or S atoms) and/or organometallic complexes (i.e. conjugation via the metal atom) are present in the main chain. In contrast, units such as simple (thio)ether bridges, ester linkages, amide or imide linkages are clearly defined as nonconjugated segments.

The general structure of PLEDs is disclosed in the abovementioned patent applications or patents and is also described in more detail below. Further refinements (for example passive matrix addressing, active matrix addressing) are likewise known but are not of critical importance for the further description of the present patent application.

At present, the commercialization of both single-color and multicolor or full-color displays based on PLEDs is being evaluated. While single-color displays may be able to be produced by means of simple coating technologies (e.g. doctor blade coating, spin coating), multicolor and full-color display elements will very probably require the use of printing processes (e.g. ink jet printing, offset printing, gravure printing processes, screen printing processes). However, all these processes require soluble polymers.

Some of the conjugated polymers disclosed in the abovementioned patent applications display good properties for the applications mentioned. Important properties include, in particular, the following:

High luminous efficiency and energy efficiency when used in PLEDs.
Long operating life when used in PLEDs.
Low operating voltage,
Good storage stability, both when used in PLEDs and also before introduction into corresponding devices.
Good solubility in organic solvents in order to make an appropriate coating process possible at all.
Reasonable availability to make economical use in mass-produced products possible.
Ability to achieve various colors to make full-color displays possible.

It has now surprisingly been found that an improved, further-developed novel class of conjugated polymers has very good properties which are superior to the abovementioned prior art, These polymers and their use in PLEDs are subject matter of the present invention.

The invention provides conjugated polymers which comprise units of the formula (I)

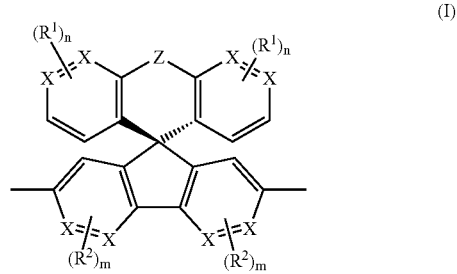

(I)

together with one or more units selected from the following groups:

group 1: units which significantly increase the hole injection or transport properties of the polymers;
group 2: units which significantly increase the electron injection or transport properties of the polymers,
group 3: units which comprise combinations of individual units of group 1 and group 2;
group 4: units which alter the emission characteristics so that phosphorescence can be obtained instead of fluorescence;

where the symbols and indices have the following meanings:
X is identical or different on each occurrence and is in each case CH, $CR^1$ or N,
Z is identical or different on each occurrence and is in each case a single chemical bond, a $CR^3R^4$ group, a —$CR^3R^4$—$CR^3R^4$— group, a —$CR^3$=$CR^4$— group, O, S, N—$R^5$, C=O, C=$CR^3R^4$ or $SiR^3R^4$;
$R^1$ is identical or different on each occurrence and is in each case a linear, branched or cyclic alkyl or alkoxy chain which has from 1 to 22 carbon atoms and in which one or more nonadjacent carbon atoms may also be replaced by N—$R^5$, O, S, —CO—O—, O—CO—O, where one or more H atoms may also be replaced by fluorine, or is an aryl or aryloxy group which has from 5 to 40 carbon atoms and in which one or more carbon atoms may also be replaced by O, S or N, which may also be substituted by one or more nonaromatic radicals $R^1$, or is Cl, F, CN, $N(R^5)_2$, $N(R^5)_3{}^+$, where two or more radicals $R^1$ may also together form a ring system;

$R^2$ is identical or different on each occurrence and is in each case a linear, branched or cyclic alkyl or alkoxy chain which has from 1 to 22 carbon atoms and in which one or more nonadjacent carbon atoms may also be replaced by $N-R^5$, O, S, —CO—O—, O—CO—O, where one or more H atoms may also be replaced by fluorine, or is an aryl or aryloxy group which has from 5 to 40 carbon atoms and in which one or more carbon atoms may also be replaced by O, S or N which may also be substituted by one or more nonaromatic radicals $R^1$, or is CN;

$R^3$, $R^4$ are identical or different on each occurrence and are each H, a linear, branched or cyclic alkyl chain which has from 1 to 22 carbon atoms and in which one or more nonadjacent carbon atoms may also be replaced by $N-R^5$, O, S, —CO—O—, O—CO—O, where one or more H atoms may also be replaced by fluorine, or are each an aryl group which has from 5 to 40 carbon atoms and in which one or more carbon atoms may also be replaced by O, S or N, which may also be substituted by one or more nonaromatic radicals $R^1$, or are each CN; where a plurality of adjacent radicals $R^3$ and/or $R^4$ may together also form a ring;

$R^5$ is identical or different on each occurrence and is in each case H, a linear, branched or cyclic alkyl chain which has from 1 to 22 carbon atoms and in which one or more nonadjacent carbon atoms may also be replaced by O, S, —CO—O—, O—CO—O, where one or more H atoms may also be replaced by fluorine, or is an aryl group which has from 5 to 40 carbon atoms and in which one or more carbon atoms may also be replaced by O, S or N, which may also be substituted by one or more nonaromatic radicals $R^1$, m is identical or different on each occurrence and is in each case 0, 1, 2, or 3, preferably 0, 1 or 2, particularly preferably 0 or 1;

n is identical or different on each occurrence and is in each case 0, 1, 2, 3 or 4, preferably 0, 1 or 2, particularly preferably 1 or 2;

with the proviso that repeating units of the formula (I) and units of groups 1 to 4 together make up at least 40%, preferably at least 60%, particularly preferably at least 80%, of all repeating units in the polymer and that the ratio of repeating units of the formula (I) to the sum of those of groups 1 to 4 is in the range from 20:1 to 1:2, preferably from 5:1 to 1:2, particularly preferably from 3:1 to 1:1.

Preferred units of group 1 are those of the formulae (II) to (XIX),

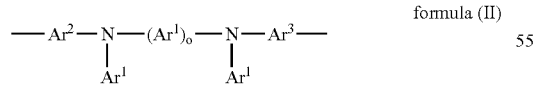

formula (II)

formula (III)

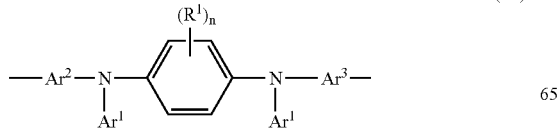

formula (IV)

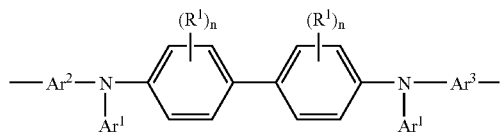

formula (V)

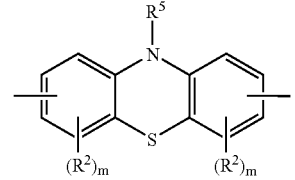

formula (VI)

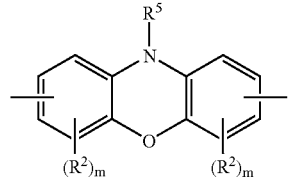

formula (VII)

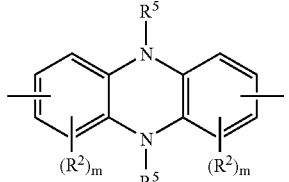

formula (VIII)

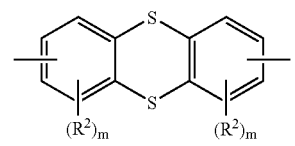

formula (IX)

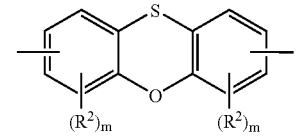

formula (X)

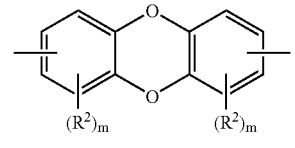

formula (XI)

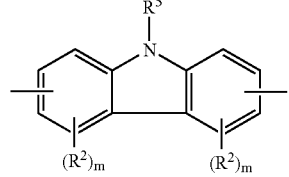

formula (XII)

-continued

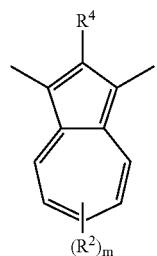
formula (XIII)

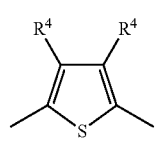
formula (XIV)

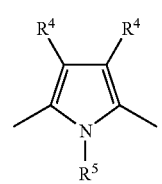
formula (XV)

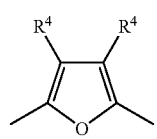
formula (XVI)

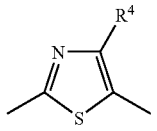
formula (XVII)

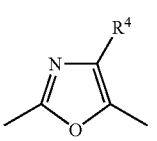
formula (XVIII)

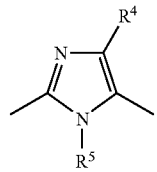
formula (XIX)

where the symbols $R^1$, $R^2$, $R^4$, $R^5$ and the indices n and m are as defined under the formula (I) and $Ar^1$, $Ar^2$, $Ar^3$ are identical or different on each occurrence and are aromatic or heteroaromatic hydrocarbons which have from 2 to 40 carbon atoms and may be substituted by one or more nonaromatic radicals $R^1$; preferably substituted or unsubstituted aromatic hydrocarbons having from 6 to 20 carbon atoms, very particularly preferably appropriate benzene, naphthalene, anthracene, pyrene or perylene derivatives;

o is 1, 2 or 3, preferably 1 or 2.

Preferred units of group 2 are those of the formulae (XX) to (XXX)

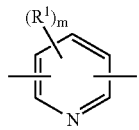
formula (XX)

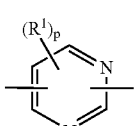
formula (XXI)

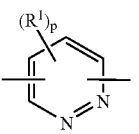
formula (XXII)

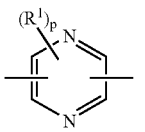
formula (XXIII)

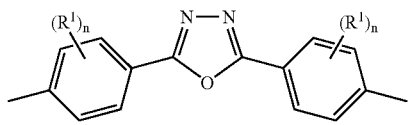
formula (XXIV)

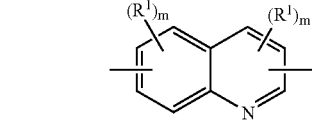
formula (XXV)

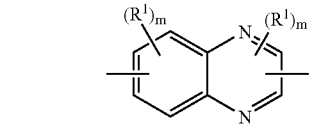
formula (XXVI)

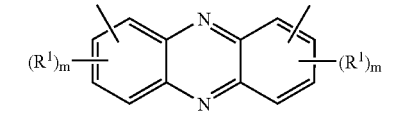
formula (XXVII)

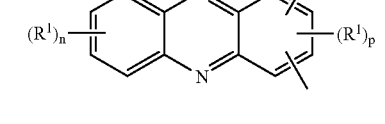
formula (XXVIII)

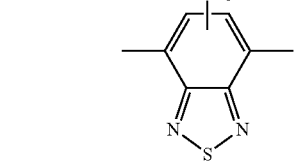
formula (XXIX)

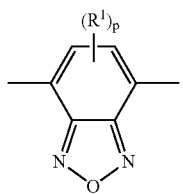
formula (XXX)
where the symbols R¹ and indices m and n are as defined under the formula (I) and
p is 0, 1 or 2, preferably 0 or 1.
Preferred units of group 3 are those of the formulae (XXXI) to (XXXXVI),
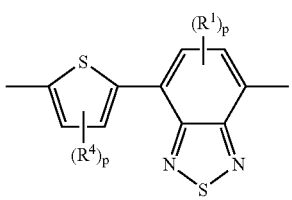
formula (XXXI)
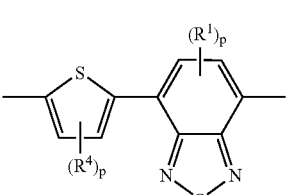
formula (XXXII)
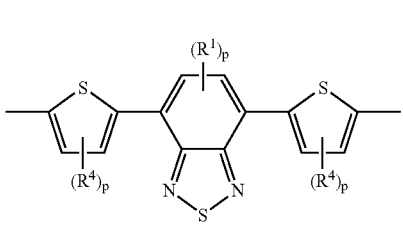
formula (XXXIII)
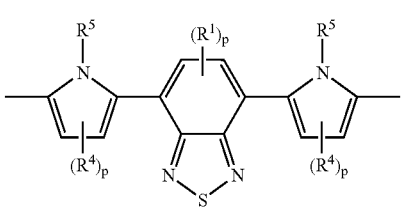
formula (XXXIV)
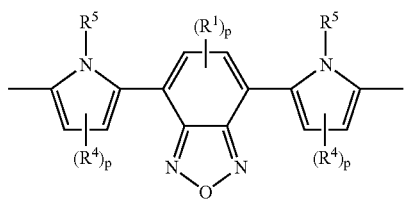
formula (XXXV)
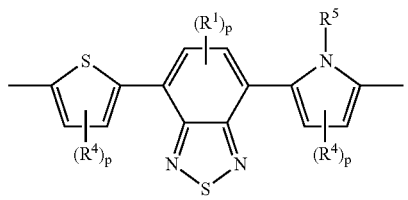
formula (XXXVI)
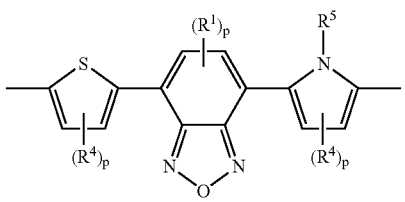
formula (XXXVII)
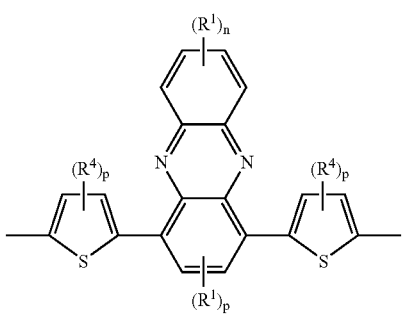
formula (XXXVIII)
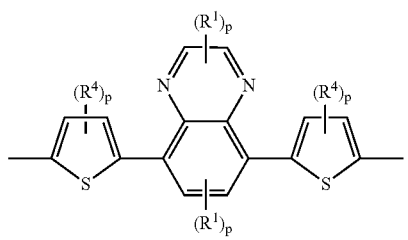
formula (XXXIX)
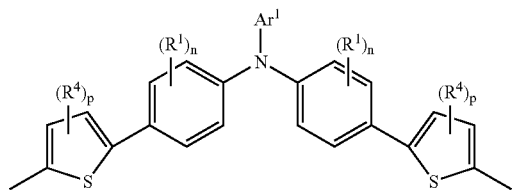
formula (XXXX)
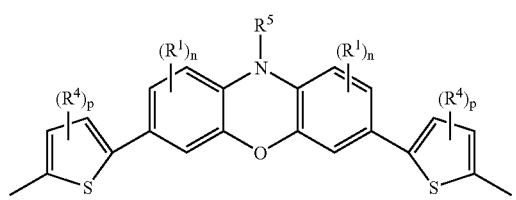
formula (XXXXI)

-continued formula (XXXXII)

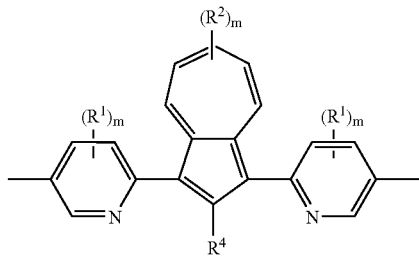

formula (XXXXIII)

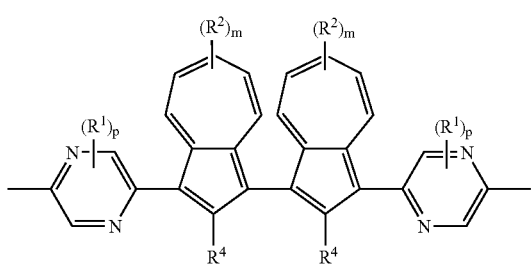

formula (XXXXIV)

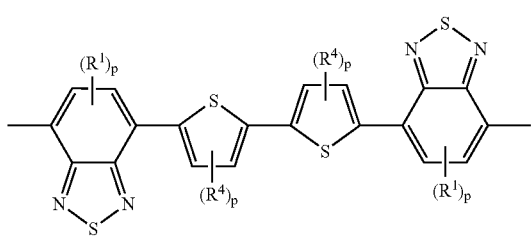

formula (XXXXV)

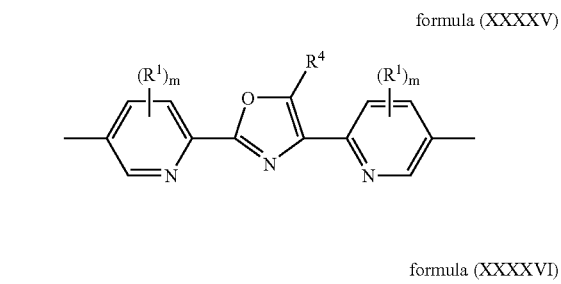

formula (XXXXVI)

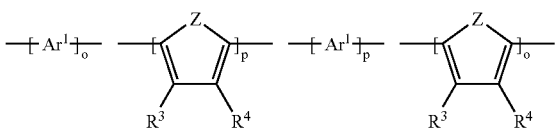

where the symbols $Ar^1$, $R^1$, $R^2$, $R^3$, $R^4$, $R^5$, Z and the indices m, n and p are as defined under the formula (I) and
o is 1, 2 or 3, preferably 1 or 2;
p is 0, 1 or 2, preferably 0 or 1.

Preferred units of group 4 are those of the formulae (XXXXVII) to (XXXXX), formula (XXXXVII)

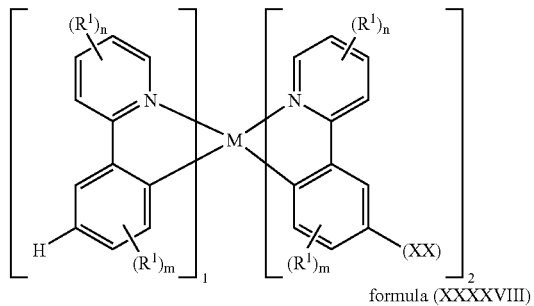

formula (XXXXVIII)

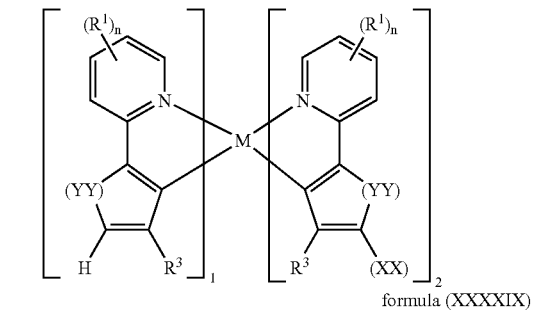

formula (XXXXIX)

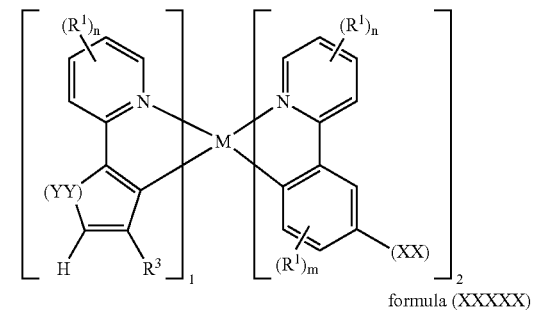

formula (XXXXX)

where the symbols $R^1$, $R^3$ and the indices m and n are as defined under the formula (I) and
M is Rh or Ir
XX corresponds to the point of linkage in the polymer,
YY is identical or different on each occurrence and is in each case O, S or Se.

Preference is given to polymers according to the invention in which structural units of the formula (I) are present together with structural units of at least two of the groups 1 to 4.

Particular preference is in this case given to the simultaneous presence of units of groups 1 and 2, or 1 and 3, or 1 and 4, or 2 and 3, or 2 and 4, or 3 and 4.

Preference is also given to the simultaneous presence of structures from groups 1 and 2 and 3, or 1 and 2 and 4, or 2 and 3 and 4.

It is thus likewise particularly preferred for units of the formulae (II) to (V) and units of the formulae (XXIV) or (XXVI) to (XXX) to be present simultaneously.

Furthermore, it is likewise preferred for more than one structural unit from one group to be simultaneously present. Thus, preference is given to at least two structural units from group 1, or from group 2, or from group 3, or from group 4 being present simultaneously.

Even when not indicated by the description, it may here be explicitly stated that the structural units of the formula (I) can be unsymmetrically substituted, i.e. different substituents $R^1$ and/or $R^2$ can be present on one unit, or these can also have different positions on each of the two sides.

The synthesis of the corresponding monomers is, for example, described in detail in the abovementioned patent applications and patents.

Thus, for example, monomers which then give structures of the formula (I) in the polymer can be synthesized as described in EP-A-0676461, EP-A-0707020, EP-A-0894107 and the literature references cited therein.

The polymers of the invention are different from the previously known polyspirobifluorenes (as described in EP-A-0 707 020 and EP-A-0 894 107): although these patent applications described polymers which can comprise structures of the formula (I), no mention is made of the formulae (II) to (XXXXX). Although copolymers in which these are present are disclosed, these copolymers comprise, according to the descriptions, mainly arylene or vinylene structures in addition to the structures of the formula (I). The presence of elements of the structures (II) to (XXXXX) brings the following surprising advantages:

(1) If structures of the formulae (II) to (XIX) are present, improved charge injection and transport, especially for holes, is observed. In use, this leads to a higher current and thus also a higher luminance being achieved at a given voltage. This is of critical importance especially for mobile applications (e.g. displays for mobile telephones, PDAs, etc.), since the maximum operating voltage is restricted here. For further details, see Example P1 (comparison: C1-C3); also P2-P19, P21-P23, P25-P32, P34-P41.

(2) If structures of the formulae (XX) to (XXX) are present, an analogous situation is observed for electrons. This can have advantages similar to those described under (1). If both structures of the formulae (II) to (XIX) and structures of the formulae (XX) to (XXX) are present, this can further increase the effect. For further details, see Examples P12-P24, P40, P41 (comparison: C1-C3).

(3) Structures of the formulae (XXIX) to (XXXXV) make variation of the electronic band gap possible, and thus allow alteration of the color properties. While mainly blue emission is mentioned in the abovementioned applications, the use of these structures makes it possible to achieve blue-green, green, yellow, orange and red emission as well. For further details, see P12-P35, P40, P41 (comparison: C1).

(4) The structures of the formulae (XXXXVII) to (XXXXX) lead to a different type of emission (known as phosphorescence) occurring. This can give a higher quantum efficiency and thus also contribute to an improvement in corresponding components.

The polymers of the invention generally have from 10 to 10 000, preferably from 50 to 5000, particularly preferably from 50 to 2000, repeating units.

The necessary solubility is ensured, in particular, by the substituents $R^1$, $R^3$ and/or $R^4$. If substituents $R^2$ are present, these also contribute to the solubility.

To ensure sufficient solubility, it is necessary for on average at least 2 nonaromatic carbon atoms per repeating unit to be present in the substituents. Preference is given to at least 4, particularly preferably at least 8, carbon atoms. Some of these carbon atoms may also be replaced by O or S. This can, however, mean that a certain proportion of repeating units, both of the formulae (I) to (XXXXX) and of other structural types, bear no further nonaromatic substituents.

To prevent morphology of the film being impaired, it is preferred that there are no long-chain substituents having more than 12 carbon atoms in a linear chain, preferably none having more than 8 carbon atoms, particularly preferably none having more than 6 carbon atoms.

Nonaromatic carbon atoms are, as in the description of, for example, $R^1$, present in appropriate linear, branched or cyclic alkyl or alkoxy chains.

Preference is given to polymers according to the invention in which X=C—H or C—$R^1$. Preference is also given to polymers according to the invention in which the symbol Z represents a single chemical bond.

Furthermore, preference is given to polymers according to the invention in which:

$R^1$ is identical or different on each occurrence and is in each case a linear or branched alkyl or alkoxy chain having from 1 to 8 carbon atoms, or is an aryl group having from 6 to 10 carbon atoms, which are also substituted by one or more nonaromatic radicals $R^1$;

n are identical or different and are each 1 or 2.

Furthermore, particular preference is given to polymers according to the invention in which:

$R^1$ is identical or different on each occurrence and is in each case a linear or branched alkyl or alkoxy chain having from 1 to 8 carbon atoms, or is an aryl group having from 6 to 10 carbon atoms, which are also substituted by one or more nonaromatic radicals $R^1$;

n are identical or different and are each 1 or 2.

Furthermore, preference is given to polymers according to the invention in which:

$R^2$ is identical or different on each occurrence and is in each case a linear or branched alkyl or alkoxy chain having from 1 to 10 carbon atoms, where one or more H atoms may also be replaced by fluorine, or is an aryl or aryloxy group having from 6 to 14 carbon atoms, which may also be substituted by one or more nonaromatic radicals $R^1$, or is CN;

m is identical or different on each occurrence and is in each case 0 or 1.

Furthermore, particular preference is given to polymers according to the invention in which:

$R^2$ is identical or different on each occurrence and is in each case a linear or branched alkyl or alkoxy chain having from 1 to 8 carbon atoms, where one or more H atoms may also be replaced by fluorine, or is an aryl group having from 6 to 10 carbon atoms, which may also be substituted by one or more nonaromatic radicals $R^1$;

m is identical or different on each occurrence and is in each case 0 or 1, where m is equal to 0 for at least 50%, preferably at least 70%, very particularly preferably at least 90%, of all repeating units of the formula (I) or (VI) to (XIII) present in the polymer.

Preference is also given to polymers according to the invention in which:

$R^3$, $R^4$ are identical or different on each occurrence and are each a linear, branched or cyclic alkyl chain which has from 1 to 10 carbon atoms and in which one or more nonadjacent carbon atoms may also be replaced by O, where one or more H atoms may also be replaced by fluorine, or are each an aryl group which has from 5 to 40 carbon atoms and in which one or more carbon atoms may also be replaced by O, S or N, which may also be substituted by one or more aromatic radicals $R^1$.

The polymers of the invention are per se copolymers which have at least two different repeating units (one of the formula (I), one selected from among the formulae (II) to (XXXXX). The copolymers of the invention can have random, alternating or block structures, or have a plurality of these structures present in an alternating fashion.

However, preference is also given to copolymers according to the invention which have one or more different structures of the formula (I) and/or one or more different structures of the formulae (II) to (XXXXX).

The use of a plurality of different structural elements enables properties such as solubility, solid-state morphology, color, charge injection and transport properties, thermal stability, electrooptical characteristics, etc., to be adjusted.

Preferred polymers according to the invention are polymers in which at least one structural element has charge transport properties.

For the purposes of the present patent application, such structural elements are as follows: if HOMOPOLYMERS or OLIGOMERS were produced from these structural elements, they would have a higher charge carrier mobility, at least for one charge carrier, i.e. either electrons or holes, as is the case for a polymer consisting exclusively of structural elements of the formula (I). The charge carrier mobility (measured in $cm^2/(V*s)$) is preferably at least a factor of 10 higher, particularly preferably a factor of at least 50 higher.

Structural elements which have hole transport properties are, for example, triarylamine derivatives, benzidine derivatives, tetraarylene-para-phenylenediamine derivatives, phenothiazine derivatives, phenoxazine derivatives, dihydrophenazine derivatives, thianthrene derivatives, benzo-p-dioxin derivatives, phenoxathiine derivatives, carbazole derivatives, azulene derivatives, thiophene derivatives, pyrrole derivatives, furan derivatives and further O, S or N-containing heterocycles having a high HOMO (HOMO=highest occupied molecular orbital); these heterocycles preferably lead to an HOMO in the polymer of less than 5.8 eV (relative to vacuum level), particularly preferably less than 5.5 eV.

Preference is given to polymers according to the invention which further comprise at least one structural unit of the formulae (II) to (XXX). The proportion of these structural elements is at least 1%, preferably at least 5%. The maximum proportion is 50%, preferably 30%. These structural units, too, can be incorporated randomly, in an alternating fashion or as blocks in the polymer.

The way in which the structures are incorporated has already been indicated directly for many of them (cf., for example, formulae (II) to (V) and formulae (XIII) to (XIX)). In the case of other structures, a number of possibilities are in each case possible according to the invention. However, in these cases there are also preferred ways in which they can be incorporated:

In the case of the N-containing tricyclic heterocycles (formula (VI) to formula (VIII)), linkage via carbon atoms in the para position relative to the nitrogen (i.e. in the case of phenothiazine and phenoxazine derivatives: 3,7 positions; in the case of dihydrophenazine derivatives: 2,7 or 3,7 positions) is preferred in each case. An analogous situation applies to carbazole derivatives (formula (XII)). On the other hand, in the case of the O- and/or S-containing tricycles (formulae (IX) to (XI)), both ortho and para positions relative to one of the heteroatoms are preferred. In the case of heterocycles in which more than the ring is present, linkage to the polymer via only one ring or via two rings is possible.

Monomers for the incorporation of structural units of formula (II), formula (III), formula (IV) and formula (V) can be synthesized, for example, as described in WO98/06773.

Monomers for the incorporation of structural units of formula (VI), formula (VII) and formula (VIII) can be synthesized, for example, as described by M. Jovanovic et al., *J. Org. Chem.* 1984, 49, 1905, and H. J. Shine et al., *J. Org. Chem.* 1979, 44, 3310. Monomers for the incorporation of structural units of formula (IX) and formula (X) can be synthesized, for example, as described in J. Lovell et al., *Tetrahedron* 1996, 52, 4745, U.S. Pat. No. 4,505,841 and the references cited therein.

Monomers for the incorporation of structural units of formula (XI) can be synthesized, for example, as described by A. D. Kuntsevich et al., *Zh. Obshch. Khim.* 1994, 64, 1722, and A. D. Kuntsevich et al., *Dokl. Akad. Nauk* 1993, 332, 461. Many halogenated monomers for the incorporation of structural units of the formula (XII) are known from the literature and some of them are even commercially available. A listing of all possible methods would go beyond the scope of the present patent application.

Monomers for the incorporation of structural units of the formula (XIII) can, for example, be synthesized as described by R. H. Mitchell et al., *Org. Prep. Proced. Int.* 1997, 29, 715.

Many halogenated monomers for the incorporation of structural units of the formula (XIV) are known from the literature and some of them are even commercially available. A listing of all possible methods would go beyond the scope of the present patent application.

Monomers for the incorporation of structural units of the formula (XV) can be synthesized, for example, as described by H. M. Gilow et al., *J. Org. Chem.* 1981, 46, 2221, and G. A. Cordell, *J. Org. Chem.* 1975, 40, 3161.

Monomers for the incorporation of structural units of the formula (XVI) can be synthesized, for example, as described by M. A. Keegstra et al., *Synth. Commun.* 1990, 20, 3371, and R. Sornay et al., *Bull. Soc. Chim. Fr.* 1971, 3, 990, and some of them are also commercially available.

Some monomers for the incorporation of structural units of the formula (XVII) are commercially available.

Monomers for the incorporation of structural units of the formula (XVIII) can be synthesized, for example, as described in JP 63-250385.

Monomers for the incorporation of structural units of the formula (XIX) can be synthesized, for example, as described by M. El Borai et al., *Pol. J. Chem.* 1981, 55, 1659, and some of them are also commercially available.

The literature references listed here for the synthesis of monomers which in the polymer give structures of the formulae (II) to (XIX) describe mainly the synthesis of halogen derivatives, preferably bromine derivatives. From these, a person skilled in the art can easily prepare, for example, boronic acid derivatives or stannates. This can be achieved, for example, by metallation (e.g. by means of Mg (Grignard reaction) or Li (e.g. by means of Bu—Li)) and subsequent reaction with appropriate boron or tin derivatives, e.g. trialkyl borates or trialkyltin halides. It is, however, naturally also possible to produce boronic acid derivatives from the corresponding bromides in the presence of transition metal catalysts using boranes or diboranes. There is a great variety of further methods known from the literature and these can naturally also be used by a person skilled in the art.

Structural elements of group 2 are, for example, pyridine derivatives, pyrimidine derivatives, pyridazine derivatives, pyrazine derivatives, oxadiazole derivatives, quinoline derivatives, quinoxaline derivatives, phenazine derivatives and further O-, S- or N-containing heterocycles having a low LUMO (LUMO=lowest unoccupied molecular orbital); these heterocycles preferably lead to an LUMO in the polymer of more than 2.7 eV (relative to vacuum level), particularly preferably more than 3.0 eV.

Preference is given to polymers according to the invention which contain at least one structural unit of the formulae (XX) to (XXX). The proportion of these structural elements is at least one 1%, preferably at least 5%. The maximum proportion is 70%, preferably 50%. These structural units, too, can be incorporated randomly, in an alternating fashion or in blocks in the polymer.

The way in which the structures are incorporated has already been indicated directly for many of them (cf., for example, formulae (XXIV), (XXIX) und (XXX)). In the case of other structures, a number of possibilities are in each case possible according to the invention. However, in these cases there are also preferred ways in which they can be incorporated:

In the case of pyridine derivatives, linkage via the 2,5 or 2,6 positions is preferred, in the case of pyrazine and pyrimidine derivatives that via the 2,5 positions is preferred and in the case of pyridazine derivatives that via the 3,6 positions is preferred. In the case of the bicyclic heterocycles, a plurality of linkages are generally possible and also preferred. However, in the case of quinoxaline, linkage via the 5,8 positions is unambiguously preferred.

In the case of phenazine, it may, as indicated, be preferred that linkage occurs via the two outer rings or that incorporation is via only one ring. Preferred positions are therefore incorporation at carbon atoms 1,4 or 2,3 or 2,7 or 3,7.

The chemistry of pyridine derivatives (XX) has been examined in great detail. Thus, the preparation of 2,5- and 2,6-dihalopyridines is likewise known. Reference may here be made to the numerous standard works on heterocyclic chemistry. Furthermore, many of the compounds are also commercially available. Monomers for the incorporation of structural units of the formula (XXI) can be synthesized, for example, as described in Arantz et al., *J. Chem. Soc. C* 1971, 1889. Monomers for the incorporation of structural units of the formula (XXII) can be synthesized, for example, as described in Pedrali et al., *J. Org. Synth.* 1958, 23, 778.

Monomers for the incorporation of structural units of the formula (XXIII) can be synthesized, for example, as described by Ellingson et al., *J. Am. Chem. Soc.* 1949, 71, 2798.

Monomers for the incorporation of structural units of the formula (XXIV) can be synthesized, for example, as described in Stolle et al., *J. Prakt. Chem.* 1904, 69, 480.

Monomers for the incorporation of structural units of the formula (XXV) can be synthesized, for example, as described in Metzger, *Chem. Ber.* 1884, 17, 187, and A. I. Tochilkin et al., *Chem. Heterocycl. Compd. (Engl. Transl)* 1988, 892. Monomers for the incorporation of structural units of the formula (XXVI) can be synthesized, for example, as described in Calhane et al., *J. Am. Chem. Soc.* 1899, 22, 457, and T. Yamamoto et al., *J. Am. Chem. Soc.* 1996, 118, 3930. Monomers for the incorporation of structural units of the formulae (XXVII) and (XXVIII) can be synthesized, for example, as described in L. Horner et al., *J. Liebigs Ann. Chem.*, 1955, 597, 1, and P. R. Buckland et al., *J. Chem. Res. Miniprint* 1981, 12, 4201.

Monomers for the incorporation of structural units of the formula (XXIX) can be synthesized, for example, as described in K. Pilgram et al., *J. Heterocycl. Chem.* 1970, 7, 629, and WO 00/55927.

Monomers for the incorporation of structural units of the formula (XXX) can be synthesized, for example, as described in Hammick et al., *J. Chem. Soc.* 1931, 3308, and K. Pilgram et al., *J. Heterocyl. Chem.* 1974, 11, 813.

The references cited here for the synthesis of monomers which in the polymer gives structures of the formulae (XX) to (XXX) also describe mainly the synthesis of halogen derivatives, preferably bromine derivatives. Using these as a starting point, a person skilled in the art can, as also described above for the properties which increase hole mobility, carry out further transformations, e.g. to give boronic acid derivatives or stannates.

Furthermore, preference is also given to polymers according to the invention in which units of group 3 are present.

Particular preference is accordingly given to polymers according to the invention which comprise both one or more structures of the formulae (II) to (XIX) and one or more structures of the formulae (XX) to (XXX).

The abovementioned limits for the respective proportion continue to apply here. It can be very particularly preferred for the polymers of the invention to comprise units in which structures which increase hole mobility and electron mobility follow one another directly or alternate, as is the case, for example, for the formulae (XXXI) to (XXXXV) and is indicated somewhat more generally for the formula (XXXXVI). Monomers of the formulae (XXXI) to (XXXXVI) can be synthesized by the methods indicated for the formulae (III) to (XXX) by appropriate combination of the appropriate precursors. It may also be pointed out that at least some examples of syntheses are given in the abovementioned patent applications WO 00/46321 and WO 00/55927. Such structures are also reported in, for example, in H. A. M. Mullekom et al., *Chem. Eur. J.,* 1998, 4, 1235. It may be pointed out that the structures of the formulae (XXXI) to (XXXXVI) do not in any way restrict the invention thereto, but it is naturally simple for a person skilled in the art to synthesize suitable combinations of the abovementioned structures (III) to (XIX) or (XX) to (XXX) and to incorporate these into the polymers of the invention.

Preference is also given to copolymers whose emission characteristics have been altered so that phosphorescence takes place instead of fluorescence. This is, in particular, the case when organometallic complexes have been incorporated in the main chain. Particular preference is in this case given to complexes of the d series transition metals, very particularly preferably those of the higher metals of the iron, cobalt and nickel triads, i.e. complexes of ruthenium, osmium, rhodium, iridium, palladium and platinum. Such complexes are frequently able to emit light from excited triplet states, which frequently increases the energy efficiency. The use of such complexes in low molecular weight OLEDs is described, for example, in M. A. Baldo, S. Lamansky, P. E. Burrows, M. E. Thompson, S. R. Forrest, Applied Physics Letters, 1999, 75, 4-6. Nothing has yet been reported about the incorporation of these compounds in polymers. Corresponding monomers are described in the as yet unpublished patent application DE 10109027.7. Such structural elements can also have a substantial influence on the emission color and the energy efficiency of the resulting polymers.

Examples for particularly preferred complexes which can be incorporated into the polymers of the invention are the abovementioned compounds of the formulae (XXXXVII) to (XXXXX).

The preparation of corresponding monomers is described in the above-mentioned unpublished patent application DE 10109027.7, which is hereby incorporated by reference into this disclosure of the present invention.

Preferred copolymers which further comprise additional structural elements in addition to those of the formula (I) and the formulae (II) to (XXXXX) also include ones which comprise at least one further aromatic structure or another conjugated structure which does not come under one of the above-mentioned groups, i.e. has little if any influence on the charge carrier mobilities or is not an organometallic complex. Such structural elements can influence the morphology and also the emission color of the resulting polymers.

Preference is given to aromatic structures which have from 6 to 40 carbon atoms or stilbene or bisstyrylarylene derivatives which may each be substituted by one or more nonaromatic radicals $R^1$.

Particular preference is given to the incorporation of 1,4-phenylene, 1,4-naphthylene, 1,4- or 9,10-anthracenylene, 1,6- or 2,7- or 4,9-pyrene, 3,9- or 3,10-perylene, 2,7- or 3,6-phenanthrene, 4,4'-biphenylene, 4,4"-terphenylene, 4,4'-bi-1,1'-naphthylene, 4,4'-stilbene or 4,4"-bisstyrylarylene derivatives.

These structures are also mentioned in the patent applications EP-A-0 707 020 and EP-A-0 894 107 cited at the outset, but in contrast to the information given there, these are introduced into the present novel polymers only as additional possibilities for obtaining further modifications.

Such structures are widely known in the literature and most are also commercially available. A listing of all possible synthetic variants would go far beyond the scope of the present patent application.

The polymers of the invention are generally prepared by polymerization of two or more monomers of which at least one subsequently gives structures of the formula (I) and at least one more gives structures selected from among the formulae (II) to (XXXXX).

There are in principle a relatively large number of different polymerization reactions which can be used, but the types listed below have been found to be particularly useful. In principle, all these reaction types give C—C linkages:

(A) Polymerization by the SUZUKI method: Here, monomers used are, firstly, bishalides and, secondly, bisboronic acids and corresponding derivatives, or corresponding monohalide-monoboronic acid derivatives, and these are coupled in the presence of palladium catalysts and solvents under basic conditions. Reactions of this type which lead to conjugated polymers have been described many times. There is a series of proposals for making such reactions proceed efficiently and lead to high molecular weight polymers; these are described, inter alia, in the following references: (i) EP 707.020, (ii) EP 842.208, (iii) EP 1.025.142, (iv) WO 00/53656 and (v) in the references cited therein. The corresponding descriptions are hereby incorporated by reference into the disclosure of the present patent application.

(B) Polymerizations by the YAMAMOTO method: Here, exclusively bishalides are used as monomers. The polymerizations are carried out in the presence of solvents, a nickel compound, possibly a base and, if desired, a reducing agent and also further ligands. Reactions of this type which lead to conjugated polymers have been described relatively often. There are some proposals for making such reactions proceed efficiently and lead to high molecular weight polymers; these are described, inter alia, in the following references: (i) M. Ueda et al., *Macromolecules*, 1991, 24, 2694, (ii) T. Yamamoto et al., *Macromolecules* 1992, 25, 1214, (iii) T. Yamamoto et al., *Synth. Met.* 1995, 69, 529-31, (iv) T. Yamamoto et al., *J. Organometallic Chem.* 1992, 428, 223, (v) I. Colon et al., *J. Poly. Sci.: Part A: Poly. Chem.* 1990, 28, 367, (vi) T. Yamamoto et al., *Macromol. Chem. Phys.* 1997, 198, 341. The corresponding descriptions are hereby incorporated by reference into the disclosure of the present patent application.

(C) Polymerizations by the STILLE method: Monomers used here are, firstly, bishalides and, secondly, bisstannanes, or corresponding monohalide-monostannanes, and these are coupled in the presence of palladium catalysts and solvents, possibly under basic conditions. Reactions of this type which lead to conjugated polymers have been described in the literature. However, they have not been examined to the same extent as the SUZUKI or YAMAMOTO coupling. A conjugated polymer obtained by STILLE coupling is described, for example, in W. Schorf et al., *J. Opt. Soc. Am. B* 1998, 15, 889. A review of the possibilities and the difficulties of the STILLE reaction is given, inter alia, in V. Farina, V. Krishnamurthy, W. J. Scott (editors) "The Stille Reaction" 1998, Wiley, New York, N.Y. The corresponding descriptions are hereby incorporated by reference into the disclosure of the present patent application.

After the polymerization (polycondensation) has been carried out, the polymers synthesized firstly have to be separated off from the reaction medium. This is generally achieved by precipitation in a nonsolvent. The polymers obtained subsequently have to be purified, since especially the content of low molecular weight organic impurities and also the ion content or content of other inorganic impurities sometimes have very strong effects on the use properties of the polymers in PLEDs. Thus, low molecular weight constituents can considerably reduce the efficiency and also cause a dramatic deterioration in the operating life. The presence of inorganic impurities has an analogous effect.

Suitable purification methods include, firstly, precipitation procedures in which the polymer is repeatedly dissolved and precipitated in a nonsolvent. It is advantageous to pass the polymer solution through a filter in order to separate off undissolved constituents (get particles) and also dust particles. A further possibility is the use of ion exchangers to lower the content of ions. Stirring a polymer solution with an aqueous solution containing, for example, chelating ligands, can also be helpful. Further organic or inorganic extraction processes, e.g. with solvent/nonsolvent mixtures, or using supercritical $CO_2$ can also result in considerable improvements here.

The novel polymers obtained in this way can then be used in PLEDs. This is usually done using the following general method, which then naturally has to be adapted appropriately to the specific case:

A substrate (e.g. glass or a plastic such as specially treated PET) is coated with a transparent anode material (for example indium-tin oxide, ITO); the anode is subsequently structured (e.g. photolithographically) and connected according to the desired application. It is also possible for the entire substrate and the appropriate circuitry firstly to be produced by a quite complicated process to make active matrix control possible.

After this, a conductive polymer, e.g. a doped polythiophene or polyaniline derivative, is generally firstly applied either over the entire area or only to the active (=anodic) places. This is generally carried out by coating methods in which a dispersion of the appropriate polymer is applied. This can in principle be carried out using the methods described below for the light-emitting polymer. The thickness of this polymer layer can vary within a wide range, but for practical use will be in the range from 10 to 1000 nm, preferably from 20 to 500 nm.

A solution of a polymer according to the invention is then applied, depending on the intended use. For multicolor or full-color displays, a plurality of different solutions are then applied in various regions to produce appropriate colors. The polymers of the invention are for this purpose firstly dissolved individually (it can also be advisable to use blends of two or more polymers) in a solvent or solvent mixture, possibly mechanically after-treated and subsequently filtered. Since the organic polymers and especially the interfaces in the PLED are sometimes extremely sensitive to oxygen or other constituents of the air, it is advisable to carry out this operation under protective gas. Suitable solvents include aromatic liquids such as toluene, xylenes, anisole, chlorobenzene, and also others such as cyclic ethers (e.g. dioxane, methyldioxane) or amides, for example NMP or DMF, and also solvent mixtures, as are described in the unpublished patent application DE 10111633.0.

The above-described supports can then be coated with the solutions, either over their entire area, e.g. by spin coating or doctor blade techniques, or else in a resolved manner by means of printing processes such as ink jet printing, offset printing, screen printing processes, gravure printing processes, and the like. These abovementioned solutions are novel and are thus likewise subject matter of the present invention.

If desired, electron injection materials can then be applied to these polymer layers, e.g. by vapor deposition or from solution using methods as have been described for the emitting polymers. As electron injection materials, it is possible to use, for example, low molecular weight compounds such as triarylborane compounds or aluminum trishydroxyquinolinate ($Alq_3$) or appropriate polymers such as polypyridine derivatives and the like. It is also possible to convert thin layers of the emitting polymers into electron injection layers by appropriate doping.

A cathode is subsequently applied by vapor deposition. This is generally carried out by means of a vacuum process and can, for example, be achieved either by thermal vapor deposition or by plasma spraying (sputtering). The cathode can be applied over the entire area or in a structured fashion by means of a mask. As cathode, use is generally made of metals having a low work function, e.g. alkali metals, alkaline earth metals and f series transition metals, e.g. Li, Ca, Mg, Sr, Ba, Yb, Sm, or else aluminum or alloys of metals, or multilayer structures comprising various metals. In the latter case, metals having a relatively high work function, e.g. Ag, tan be concomitantly used. It can also be preferred to introduce a very thin dielectric layer (e.g. LiF or the like) between the metal and the emitting polymer or the electron injection layer. The cathodes generally have a thickness of from 10 to 10 000 nm, preferably from 20 to 1000 nm.

The PLEDs or displays produced in this way are subsequently provided with appropriate electrical connections and encapsulated, and then tested or used.

As described above, the polymers of the invention are especially useful as electroluminescence materials in the PLEDs or displays produced in the manner described.

For the purposes of the invention, electroluminescence materials are materials which can be used as active layer in a PLED. Active layer means, in the present context, that the layer is capable of emitting light (light-emitting layer) on application of an electric field and/or that it improves the injection and/or transport of the positive and/or negative charges (charge injection layer or charge transport layer).

The invention therefore also provides for the use of a polymer according to the invention in a PLED, in particular as electroluminescence material.

The invention thus likewise provides a PLED having one or more active layers of which at least one comprises one or more polymers according to the invention. The active layer can, for example, be a light-emitting layer and/or a transport layer and/or a charge injection layer.

PLEDs are employed, for example, as self-illuminating display elements such as control lamps, alphanumeric displays, multicolor or full-color displays, information signs and in optoelectronic couplers.

The present description and the examples below describe the use of polymers according to the invention or blends of polymers according to the invention in PLEDs and the corresponding displays. Despite this restriction of the description, a person skilled in the art will easily be able, without making a further inventive step, to utilize the polymers of the invention for further applications in other electronic devices, e.g. for organic integrated circuits (O-ICs), in organic field effect transistors (OFETs), in organic thin film transistors (OTFTs), for organic solar cells (O-SCs) or organic laser diodes (O-lasers), to name only a few applications.

The present invention is illustrated by the following examples without being restricted thereto. A person skilled in the art will be able, on the basis of the description and the examples provided, to prepare further solutions according to the invention and employ these for production layers without having to make an inventive step.

Part A: Synthesis of the Monomers:

A1: Monomers for Units of the Formula (I) (Spiro Compounds)

A1.1. Preparation of Symmetrical Spiro Monomers

Preparation of 2,7-dibromo-2',3', 6',7'-tetra(2-methylbutyloxy)spirobifluorene (S-SY1) and the ethylene glycol ester of 2',3',6',7'-tetra(2-methylbutyloxy) spirobifluorene-2,7-bisboronic acid (S-SY2)

Preparation of 2,7-dibrom-2',7'-di-tert-butylspirobifluorene (S-SY3)

Preparation of the glycol ester of 2',7'-di-t-butyl-spirobifluorene-2,7-bisboronic acid (S-SY4)

The Synthesis is Described in the Unpublished German patent application DE 10114477.6.

A1.2. Preparation of Unsymmetrical Spiro Monomers

The preparation of the unsymmetrical spirobifluorene monomers was carried out according to the following scheme:

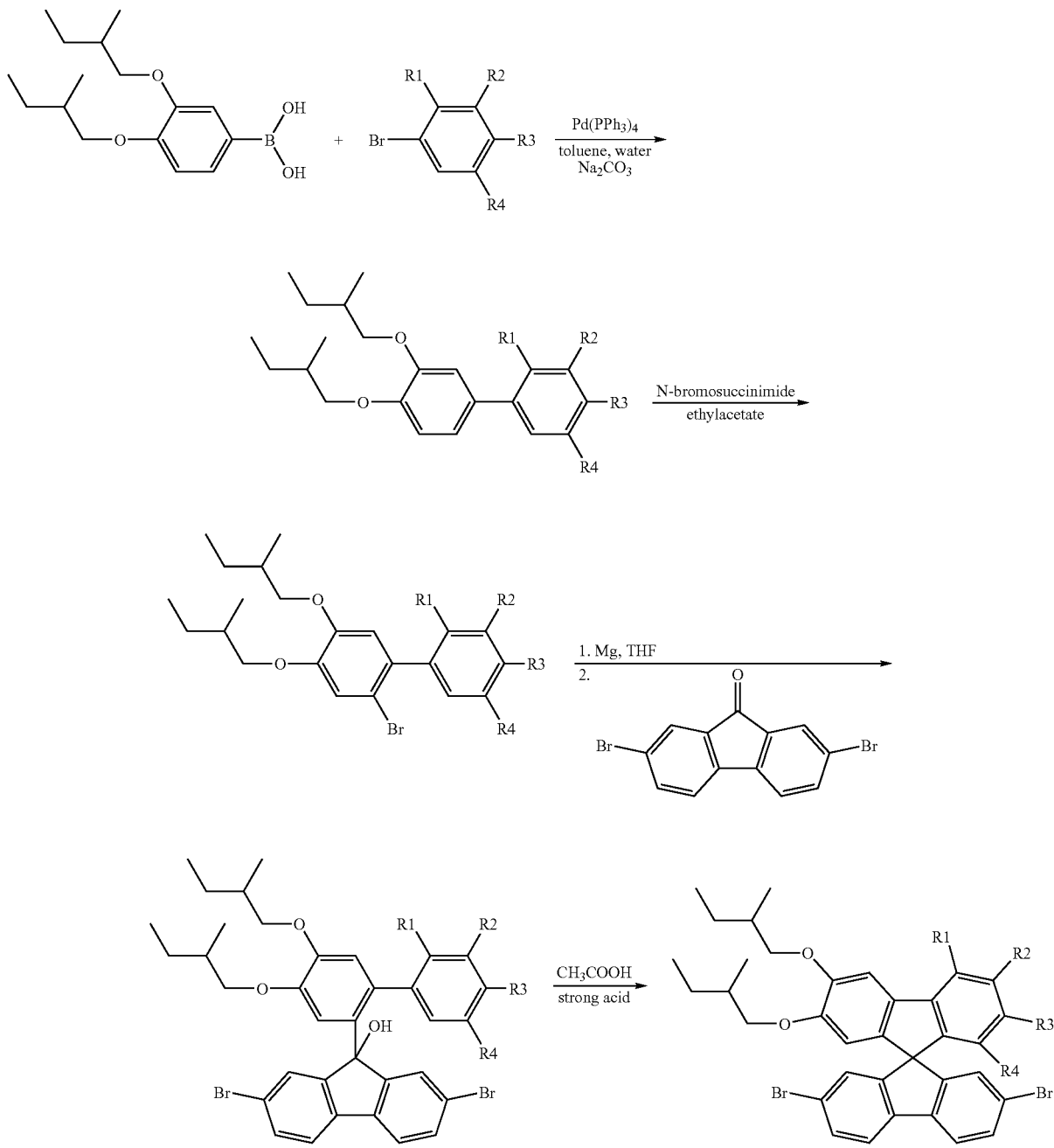

The synthesis will be described in detail for the monomer S-US1; the further monomers were prepared by an analogous method.

Preparation of 2,7-dibromo-8'-t-butyl-5'-(4''-t-butylphenyl)-2',3'-bis(2-methylbutyloxy)spirobifluorene (S-US1)

Preparation of 5'-t-butyl-2'-(4''-t-butylphenyl)-2,3-bis(2-methylbutyloxy)biphenyl 205.5 g (0.595 mol) of 2-bromo-4,4'-di-t-butylbiphenyl, 188.7 g (0.641 mol) of 3,4-bis(2-methylbutyloxy)benzeneboronic acid and 177.2 g (1.282 mol) of $K_2CO_3$ were suspended in 840 ml of toluene and 840 ml of $H_2O$ and the mixture was saturated with $N_2$ for 1 hour. 1.48 g (1.28 mmol) of $Pd(PPh_3)_4$ were subsequently added under protective gas and the mixture was stirred vigorously under reflux for about 8 hours under a blanket of protective gas. 630 ml of 1% strength NaCN solution were added and the mixture was stirred for 2 hours.

The organic phase washed three times with water, dried over $Na_2SO_4$, filtered and subsequently evaporated completely on a rotary evaporator.

This gave 300.2 g (98%) of a light-brown oil which, according to $^1H$ NMR, had a purity of 97% and was used directly in the subsequent reaction.

¹H NMR (CDCl₃, 500 MHz): [ppm]=7.5-7.3 (m, 3H); 7.23 (m, 2H); 7.08 (m, 2H); 6.81-6.87 (m, 2H); 6.51 (d, 1H); 3.87-3.7 (m, 2H, OCH₂); 3.44-3.30 (m, 2H, OCH₂); 1.88 (m, 1H, H—C); 1.71 (m, 1H, H—C); 1.62-1.42 (m, 2H, CH₂); 1.39 (s, 9H, C(CH₃)₃); 1.29 (s, 9H, C(CH₃)₃); 1.10-1.33 (m, 4H, CH₂); 1.07-0.83 (m, 12H, 4×CH₃).

Preparation of 2-bromo-5'-t-butyl-2'-(4"-t-butylphenyl)-4,5-bis(2-methylbutyloxy)biphenyl 300.2 g (0.583 mol) of 5'-t-butyl-2'-(4"-t-butylphenyl)-2,3-bis(2-methylbutyloxy)biphenyl were dissolved in 500 ml of ethyl acetate under protective gas and cooled to 0° C. 103.8 g (0.583 mol) of N-bromosuccinimide were then added as a solid and the mixture was warmed to room temperature. The reaction was complete after 1 hour. The organic phase washed three times with water, dried, evaporated on a rotary evaporator and subsequently recrystallized from ethanol. This gave 294.1 g (85%) of a colorless solid which had a purity of >99% according to ¹H-NMR and of 99.7% according to HPLC.

¹H NMR (CDCl₃, 500 MHz): [ppm]=7.45-7.35 (m, 3H); 7.19 (m, 2H); 7.06 (m, 3H); 6.50 (d, 1H); 3.87-3.70 (m, 2H, OCH₂); 3.55-3.25 (m, 2H, OCH₂); 1.88 (m, 1H, H—C); 1.67 (m, 1H, H—C); 1.62-1.42 (m, 1H, CH₂); 1.38 (s+m, 10H, C(CH₃)₃+1H); 1.27 (s+m, 10H, C(CH₃)₃+1H); 1.15 (m, 1H, CH₂); 1.12 (d, 3H, CH₃); 0.95 (t, 3H, CO₃); 0.9-0.8 (m, 6H, 2×CH₃).

Preparation of 2,7-dibromo-8'-t-butyl-5'-(4"-t-butylphenyl)-2',3'-bis(2-methylbutyloxy)spirobifluorene (S-US1)

294 g (0.495 mol) of 2-bromo-5'-t-butyl-2'-(4"-t-butylphenyl)-4,5-bis(2-methylbutyloxy)biphenyl were dissolved in 700 ml of distilled THF. 12.4 g (0.510 mol) of magnesium turnings and a few crystals of iodine were placed in a flask kept under protective gas. The mixture was heated briefly and 10% of the amount of starting material in THF was added. After the reaction had started, the remainder was added at such a rate that the reaction mixture refluxed without further introduction of heat (one hour). The mixture was refluxed for a further 3 hours and a further 100 ml of distilled THF were then added. A suspension of 189.7 g (561.2 mmol) of 2,7-dibromfluoren-9-one in 500 ml of distilled THF was cooled to 0° C. The Grignard solution was then added dropwise to the suspension at a temperature of 0-5° C. The mixture was subsequently refluxed for 90 minutes. After cooling to room temperature, the reaction mixture was admixed with a mixture of 600 ml of ice water, 33.2 ml of HCl and 900 ml of ethyl acetate and the organic phase washed twice with NaHCO₃ solution and water, subsequently dried and evaporated on a rotary evaporator. This light-brown oil was heated to boiling with 3000 ml of glacial acetic acid and 21 ml of 37% hydrochloric acid under protective gas, resulting in precipitation of a colorless solid. The mixture was heated for another 2 hours, cooled to RT, the solid was filtered off with suction and washed with 1500 ml of glacial acetic acid. A single recrystallization from 2-butanone gave 310.1 g (75%) of the product, which had a purity of >99.5% according to ¹H-NMR and of 99.8% according to HPLC.

¹H NMR (CDCl₃, 500 MHz): [ppm]=7.67 (d, 2H); 7.55 (d, 2H); 7.53-7.43 (m, 5H); 7.26 (d, 1H); 6.97 (s, 1H); 6.27 (s, 1H); 5.60 (s, 1H), 3.40-3.21 (m, 4H, OCH₂); 1.67-1.55 (m, 2H, H—C); 1.42 (s+m, 11H, C(CH₃)₃+2H); 1.19-1-01 (m, 2H); 1.27 (s+m, 10H, C(CH₃)₃+1H); 1.15 (m, 1H, CH₂); 1.12 (d, 3H, CH₃); 0.95 (t, 3H, CH₃); 0.82 (s+m, 21H, 1×C(CH₃)₃+4×CH₃).

The further monomers are summarized in the following table:

| Monomer | Starting aryl bromide | Total yield at the end of the above scheme [%] | Purity according to HPLC [%] |
|---|---|---|---|
| S-US1 | ![structure] | 62.5 | 99.8 |
| S-US2 | ![structure] | 60.3 | 99.6 |
| S-US3 | ![structure] | 27.8 | 99.8 (as a mixture of 2 isomers in a ratio of about 70/30) |
| S-US4 | ![structure] | 44.2 | 99.3 |

To give an overview, the monomers of the formula (I) whose preparation is carried out here are summarized below:

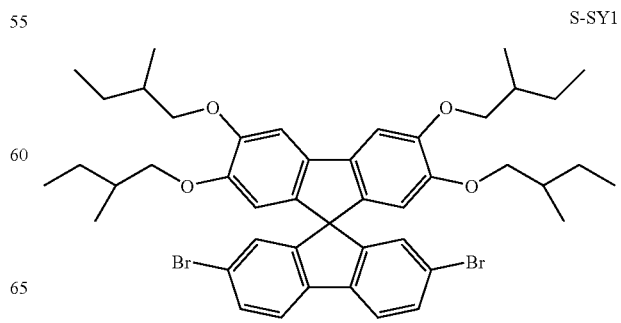

S-SY1

S-SY2
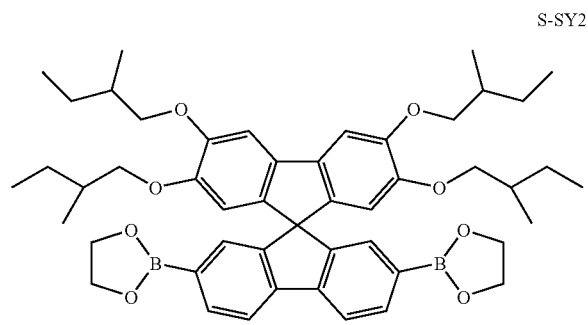

S-SY3
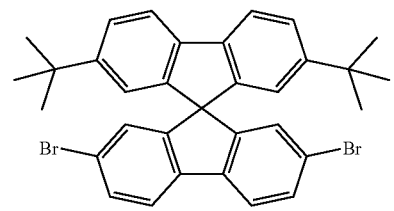

S-SY4
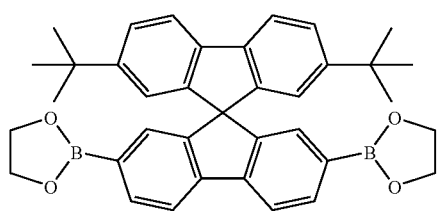

S-US1
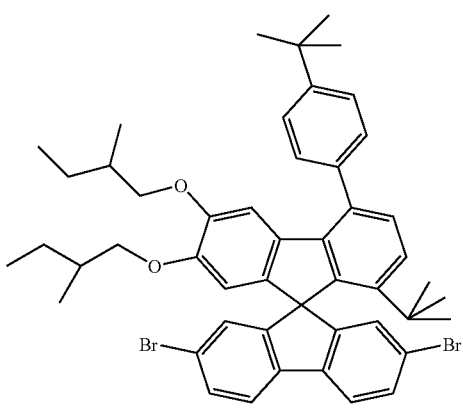

S-US2
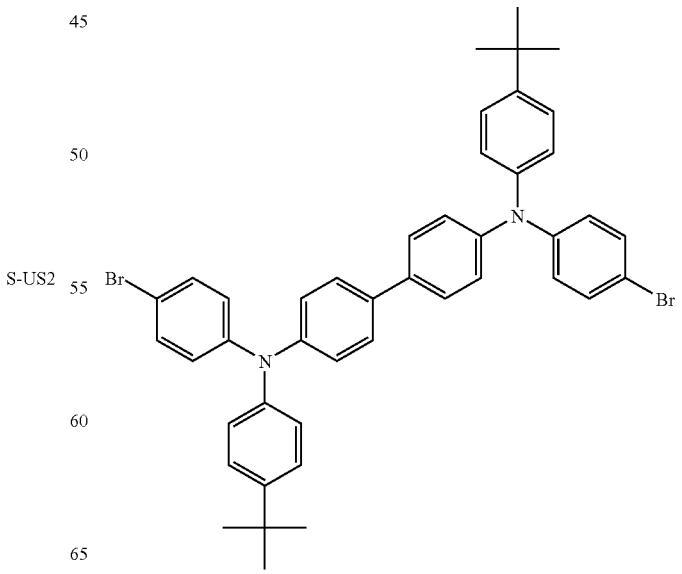

S-US3
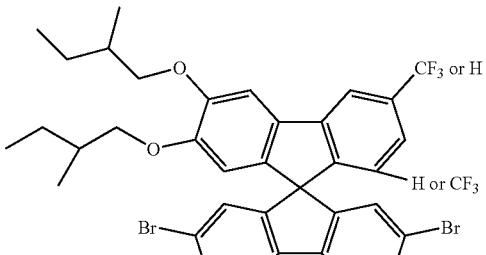

S-US4
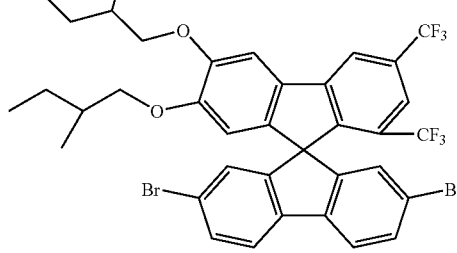

A2: Monomers for Units of the Formulae (II) to (V) (Triarylamines, Phenylenediamine Derivatives and Tetraarylbenzidines)

Preparation of N,N'-bis(4-bromophenyl)-N,N'-bis(4-tert-butylphenyl)benzidine (AM1)

Preparation of N,N'-bis(4-bromophenyl)-N,N'-bis(4-methoxyphenyl)benzidine (AM2)

Preparation of 4,4'-dibromotriphenylamine (AM3)

The synthesis is described in the unpublished German patent application DE 10114477.6.

To give an overview, the monomers of the formulae (II) to (V) whose preparation is carried out here are summarized below:

AM1
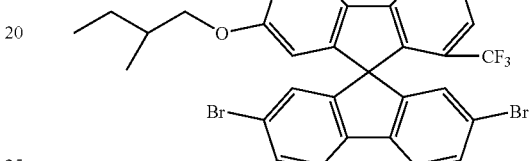

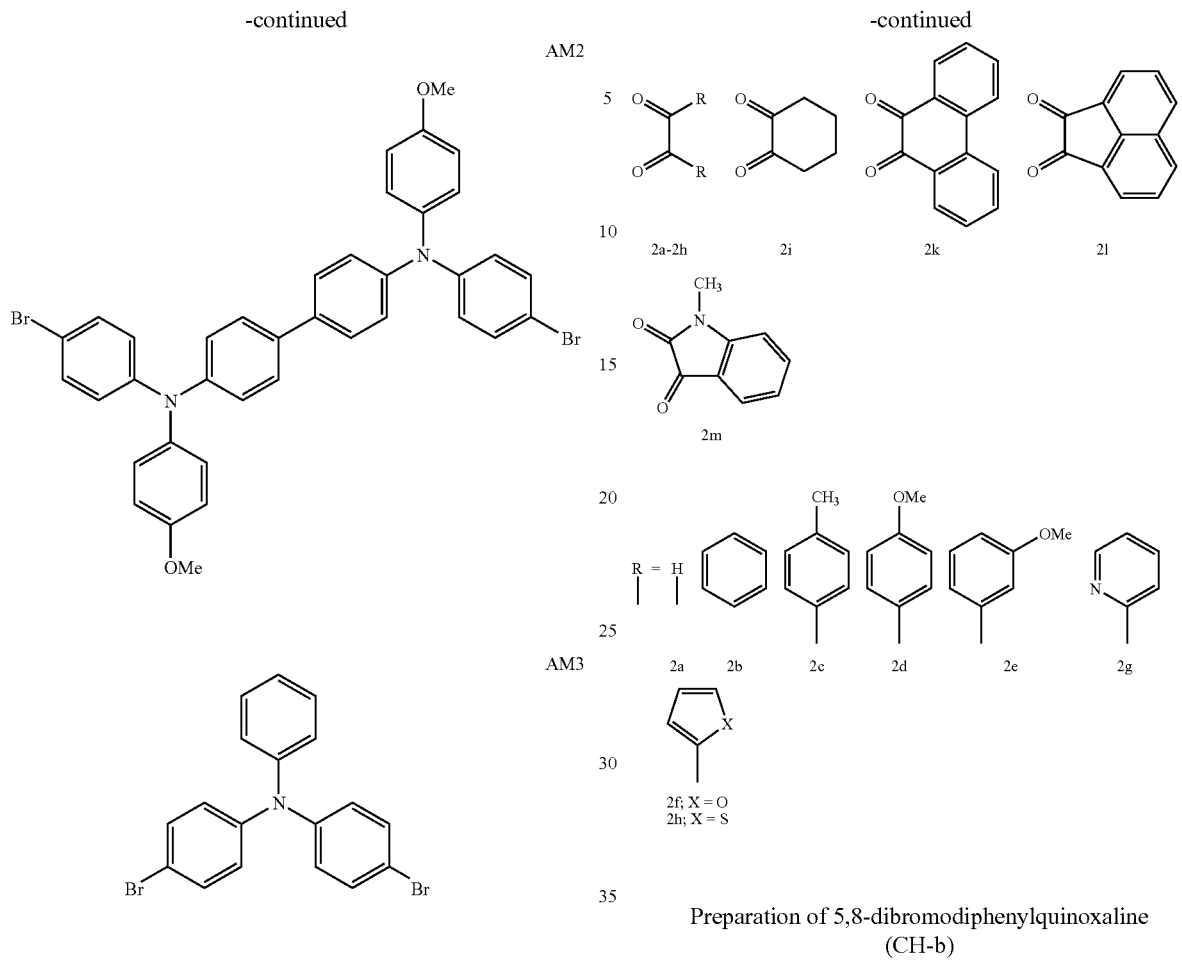

A3: Monomers for Units of the Formula (XXVI)

The preparation of substituted quinoxaline monomers was carried out according to the following scheme:

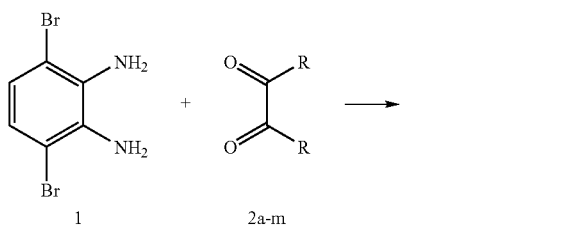

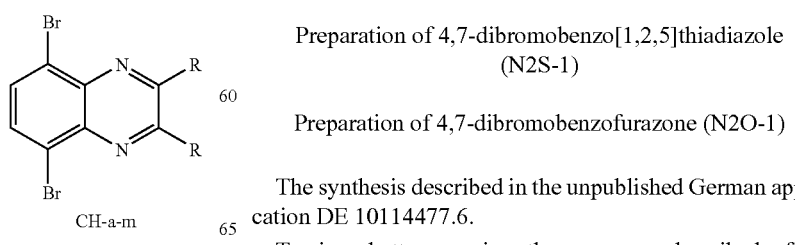

Preparation of 5,8-dibromodiphenylquinoxaline (CH-b)

A solution of 5.3 g (20 mmol) of 3,6-dibromo-1,2-phenylenediamine 1,4 g (19 mmol) of benzil 2b, 4.2 g of sodium acetate and 150 ml of glacial acetic acid were refluxed for 4 hours. The precipitate was filtered off, washed with 100 ml of water and recrystallized twice from dioxane. Drying under reduced pressure at 50° C. gave the pure product in the form of colorless crystals, which according to HPLC had a purity of about 99.5%. The yield was 6.45 g (73%).

$^1$H NMR (CDCl$_3$, 500 MHz): [ppm]=7.92 (s, 2H), 7.67 (d, $^3$J$_{HH}$=1.67 Hz, 2H), 6.66 (d, $^3$J$_{HH}$=1.67 Hz, 2H), 7.37 (m, 6H).

The other quinoxaline monomers CH-a and CH-c to CH-m were prepared in an analogous manner. The individual quinoxaline monomers are indicated in the scheme above.

A4: Monomers for Units of the Formulae (XXIX) and (XXX)

Preparation of 4,7-dibromobenzo[1,2,5]thiadiazole (N2S-1)

Preparation of 4,7-dibromobenzofurazone (N2O-1)

The synthesis described in the unpublished German application DE 10114477.6.

To give a better overview, the monomers described, of the formulae (XXIX) and (XXX), are depicted below.

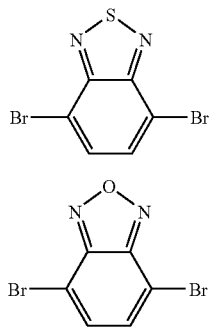

A5: Monomers for Units of the Formulae (XXXI) to (XXXXVI)

Such monomers were prepared according to the following scheme:

$^1$H NMR (CDCl$_3$, 500 MHz): [ppm]=8.11 (dd, $^3$J$_{HH}$=3.68 Hz, 2H), 7.89 (s, 2H), 7.46 (dd, $^3$J$_{HH}$=5.2 Hz, 2H), 7.21 (dd, $^3$J$_{HH}$=5.2 Hz, 2H).

Preparation of bis-4,7-(2'-bromo-5'-thienyl)-2,1,3-benzothiadiazole (N2S-1)-T2-Br2

9.51 g (54 mmol) of N-bromosuccinimide were added to a solution of 7.72 g (25.7 mmol) of bis-4,7-(thien-2-yl)-2,1,3-benzothiadiazoline in 770 ml of chloroform over a period of 15 minutes at RT in a protective gas atmosphere and with exclusion of light. The mixture was stirred for 6 hours, and 80 ml of saturated Na$_2$CO$_3$ solution were subsequently added, the organic phase was separated off and dried over Na$_2$SO$_4$. After removal of the solvent, the residue was recrystallized from DMF/EtOH. Dying at 50° C. under reduced pressure gave the product in the form of yellow-orange crystals which according to HPLC had a purity of about 99.6%. The yield was 10 g (85%).

$^1$H NMR (DMSO-d$_6$, 500 MHz): [ppm]=8.17 (s, 2H), 7.95 (d, $^3$J$_{HH}$=4.2 Hz, 2H), 7.40 (d, $^3$J$_{HH}$=4.2 Hz, 2H).

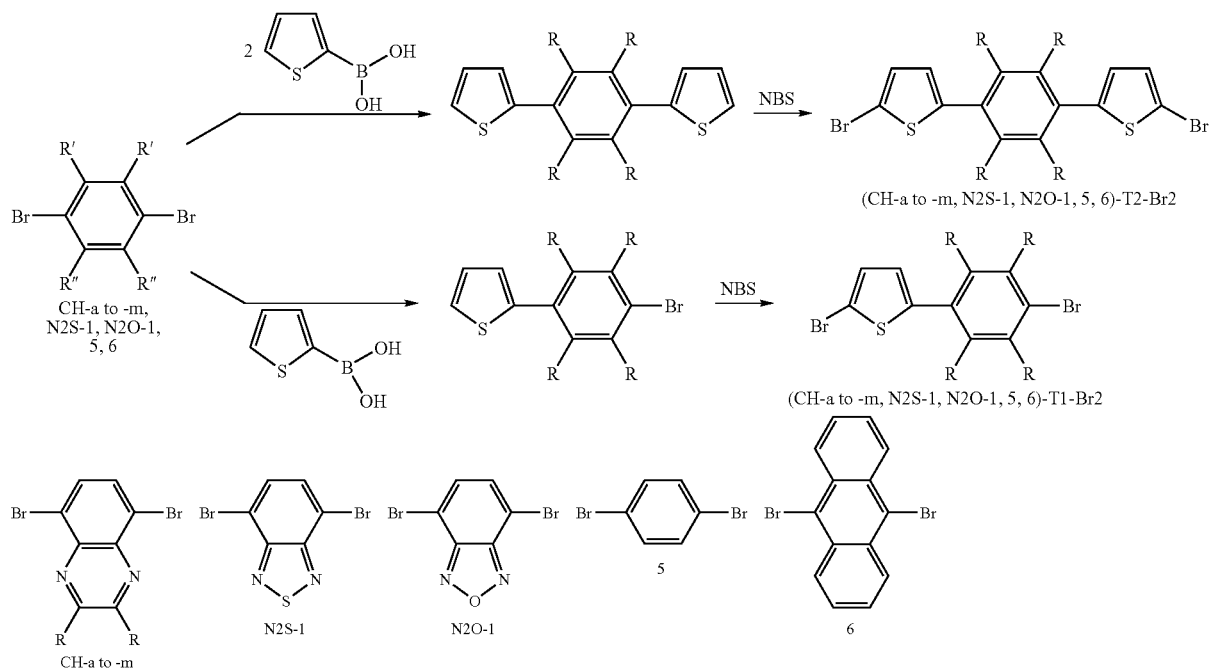

Preparation of bis-4,7-(2'-bromo-5'-thienyl)-2,1,3-benzothiadiazole (N2S-1)-T2-Br2

Preparation of bis-4,7-(thien-2-yl)-2,1,3-benzothiadiazole 13.5 g (11.7 mmol, 0.065 eq.) of Pd(PPh$_3$)$_4$ were added to a nitrogen-saturated mixture consisting of 52.92 g (180 mmol) of 1',4'-dibromo-2,1,3-benzothiadiazole, 60 g (468.9 mmol, 2.6 eq.) of thiophene-2-boronic acid, 149 g (702 mmol, 3.9 eq.) of K$_3$PO$_4$, 1 l of dioxane and 1 l of water and the suspension was heated at 80° C. for 7 hours. 0.8 g of NaCN was then added and the aqueous phase was separated off. The organic phase washed twice with H$_2$O and subsequently dried over Na$_2$SO$_4$. The solvent was removed and the residue was recrystallized twice from CH$_2$Cl$_2$/MeOH to give dark red needles which according to HPLC had a purity of about 99%. The yield was 43 g (80%).

The compounds (CH-a to CH-m, 5, 6)-T2-Br2 could be prepared analogously.

Preparation of 4-bromo-7-(2'-bromo-5'-thienyl)-2,1,3-benzothiadiazole (N2S-1)-T1-Br2

Preparation of 4-bromo-7-(thien-2-yl)-2,1,3-benzothiadiazole 6.75 g (5.85 mmol, 0.032 eq.) of Pd(PPh$_3$)$_4$ were added to a nitrogen-saturated mixture consisting of 52.92 g (180 mmol) of 1',4'-dibromo-2,1,3-benzothiadiazole, 30 g (234.4 mmol, 1.3 eq.) of thiophene-2-boronic acid, 74.5 g (351 mmol, 1.95 eq.) of K$_3$PO$_4$, 2 l of dioxane and 2 l of water and the suspension was heated at 80° C. for seven hours. 0.8 g of NaCN were then added and the aqueous phase was separated off. The organic phase washed twice with H₂O and subsequently dried over Na₂SO₄. The solvent was removed and the residue was recrystallized twice from CH₂Cl₂/MeOH to give dark red needles which according to HPLC had a purity of about 99%. The yield was 30 g (60%).

¹H NMR (CDCl₃, 500 MHz): [ppm]=8.01 (d, $^3J_{HH}$=3.9 Hz, 2H), 7.79 (d, $^3J_{HH}$=7.7 Hz, 2H), 6.64 (d, $^3J_{HH}$=7.7 Hz, 2H), 7.40 (dd, $^3J_{HH}$=5.2 Hz, 2H), 7.12 (dd, $^3J_{HH}$=5.2 Hz, 2H).

Preparation of 4-bromo-7-(2'-bromo-5'-thienyl)-2,1,3-benzothiadiazole (N2S-1)-T1-Br2

2.1 g (11.38 mmol) of N-bromosuccinimide were added to a solution of 2.93 g (9.9 mmol) of 4-bromo-7-(thien-2-yl)-2,1,3-benzothiadiazoline in 250 ml of chloroform and 150 ml of ethyl acetate over a period of 15 minutes at RT in a protective gas atmosphere and with exclusion of light. The mixture was stirred for 6 hours, and 50 ml of saturated Na₂CO₃ solution were subsequently added, the organic phase was separated off and dried over Na₂SO₄. After removal of the solvent, the residue was recrystallized from DMF/EtOH. Drying at 50° C. under reduced pressure gave the dibromo compound in the form of yellow-orange crystals which according to HPLC had a purity of about 99.6%. The yield was 3.2 g (87%).

¹H NMR (CDCl₃, 500 MHz): [ppm]=8.07 (d, $^3J_{HH}$=7.7 Hz, 1H), 8.01 (d, $^3J_{HH}$=7.7 Hz, 1H), 7.93 (d, $^3J_{HH}$=4.0 Hz, 1H), 7.38 (d, $^3J_{HH}$=4.0 Hz, 1H).

The compounds (CH-a to CH-m, 5,6)-T1-Br2 could be prepared analogously.

A6: Preparation of Further Monomers which can be Used in Copolymers:

Preparation of 1-(2-ethylhexyloxy)-4-methoxy-2,5-bis(4-bromo-2,5-dimethoxystyryl)benzene (MX-1)

10.5 g (19.5 mmol) of 1-(2-ethylhexyloxy)-4-methoxy-2,5-methylenephosphonate were dissolved in 85 ml of dry DMF and admixed under nitrogen with 2.4 g (43 mmol) of NaOMe and subsequently with 10.6 g (43 mmol) of 4-bromo-2,5-dimethoxybenzaldehyde. The orange suspension was stirred at RT for 5 hours, poured into water, the yellow precipitate was filtered off, washed with MeOH and n-hexane and recrystallized twice from toluene/hexane. This gave 11.8 g (83%) of the bisphenylenevinylene as yellow needles having a purity of 99.8%, determined by RP-HPLC.

¹H NMR (CDCl₃, 500 MHz): [ppm]=7.43 (m, 4H), 7.18 (s, 1H), 7.17 (s, 1H), 7.14 (s, 2H), 7.10 (s, 2H), 3.97 (m, 2H), 3.93 (s, 3H), 3.92 (s, 3H), 3.91 (s, 3H), 3.85 (s, 6H), 1.81 (m, 1H), 1.61 (m, 4H), 1.35 (m, 4H), 0.98 (t, $^3J_{HH}$=7.4 Hz, 3H), 0.89 (t, $^3J_{HH}$=7.3 Hz, 3H).

Preparation of 2,3,6,7-tetra-(2-methylbutyloxy)-2',7'-(4-bromostyryl)-9,9'-spirobifluorene (MX-2)

12.8 g (13.8 mmol) of 2,3,6,7-(2-methylbutyloxy)-9,9'-spirobifluorene-2',7'-methylenephosphonate were dissolved in 60 ml of dry DMF, and 1.7 g of NaOMe and 5.6 g (30.4 mmol) of bromobenzaldehyde in 20 ml of dry DMF were added one after the other. The mixture was heated at 90° C. for 6 hours, subsequently poured into water, the precipitate was filtered off with suction, washed with H₂O, MeOH and hexane and recrystallized twice from toluene/hexane. This gave the spirobifluorene in the form of yellow platelets having a purity of 99.7%, determined by RP-HPLC.

¹H NMR (CDCl₃, 500 MHz): [ppm]=7.78 (d, $^3J_{HH}$=7.7 Hz, 2H, spiro), 7.49 (dd, $^3J_{HH}$=8.0 Hz, $^4J_{HH}$=1.4 Hz, 2H, spiro), 7.40 (d, $^3J_{HH}$=9.0 Hz, 4H phenylene), 7.26 (m, 6H, phenylene, spiro), 6.91 (2 d, $^3J_{HH}$=16.1 Hz, 4H, olefin), 6.88 (s, 2H, spiro), 6.2 (s, 2H, spiro), 3.95 (m, 4H, CH₂), 3.55 (m, 4H, CH₂), 1.95 (m, 2H, CH₂), 1.75 (m, 2H, CH₂), 1.64 (m, 2H, CH), 1.48 (m, 2H, CH), 1.34 (m, 2H, CH₂), 1.18 (m, 2H, CH₂), 1.09 (d, $^3J_{HH}$=6.7 Hz, 6H, CH₃), 0.99 (t, $^3J_{HH}$=7.3 Hz, 6H, CH₃), 0.93 (d, $^3J_{HH}$=9.7 Hz, 6H, CH₃), 0.86 (t, $^3J_{HH}$=7.5 Hz, 6H, CH₃).

Preparation of 1,4-dibromo-2,5-(4-fluorostyryl)benzene (MX-3)

15.3 g of 1,4-dibromobenzene-2,5-methylenephosphonate were dissolved in 60 ml of DMF, 3.3 g (60 mmol) of NaOMe were added and a solution of 7.1 g (57 mmol) in 10 ml of DMF was subsequently added dropwise with evolution of heat. After 10 minutes, the yellow solution was poured into water and the yellow, felt-like solid was filtered off with suction and washed with water, MeOH and hexane. The solid was recrystallized three times from CHCl₃ to give 10 g (70%) of yellow needles having a purity of 99.9% (RP-HPLC).

¹H NMR (d₂-tetrachloroethane 500 MHz): [ppm]=7.85 (s, 2H, dibromophenyl), 7.53 (m, 4H, phenylene), 7.28 (d, $^3J_{HH}$=16.1 Hz, 2H, olefin), 7.09 (m, 4H, phenylene), 7.04 (d, $^3J_{HH}$=16.1 Hz, 2H, olefin).

Preparation of 2,7-dibromo-2',7'-N,N-diphenylamino-9,9'-spirobifluorene (MX-4)

(A) 2,7-Diiodo-2',7'-dibromo-9,9'-spirobifluorene 92.0 g (194.1 mmol) of 2,7-dibromospirobifluorene were dissolved in 200 ml of CHCl₃, after which 100.1 g (233 mmol) of bis(trifluoroacetoxy)iodobenzene and 59.0 g of I₂ were added and the mixture was stirred at RT under nitrogen for 12 hours. The suspension was filtered, the residue washed with CHCl₃ and recrystallized twice from 1,4-dioxane. The yield of the diiodated spirobifluorene was 121.4 g (86%) at a purity of >99% (¹H-NMR).

¹H NMR (DMSO-d₆, 500 MHz)-8.04 (d, $^3J_{HH}$=7.9 Hz, 2H), 7.88 (d, $^3J_{HH}$=7.9 Hz, 2H), 7.82 (dd, $^3J_{HH}$=7.9 Hz, $^4J_{HH}$=1.5 Hz, 2H), 7.66 (dd, $^3J_{HH}$=8.3 Hz, $^4J_{HH}$=1.9 Hz, 2H), 6.98 (d, $^4J_{HH}$=1.2 Hz, 2H), 6.83 (d, $^4J_{HH}$=1.5 Hz, 2H).

(B) 2,7-Dibromo-2',7'-N,N-diphenylamino-9,9'-spirobifluorene (MX-4)

30.0 g (41 mmol) of 2,7-diiodo-2',7'-dibromo-9,9'-spirobifluorene and 15.1 g (93 mmol) of diphenylamine were dissolved in toluene and the solution was saturated with N₂, after which 93 mg (0.41 mmol) of Pd(OAc)₂, 167 mg (0.82 mmol) of tris-o-tolylphosphine and 11 g (115 mmol) of NaO$^t$Bu were added in succession and the resulting suspension was heated at 70° C. for 12 hours. After this time, 20 ml of 1% strength NaCN solution were added dropwise, the mixture was stirred for 2 hours and the solid which precipitated was filtered off with suction. The solid was washed with H₂O and EtOH and recrystallized three times with toluene. This gave 21.7 g (65%) of the diamine in the form of colorless crystals having a purity of 99.6% (RP-HPLC).

¹H NMR (DMSO-d₆, 500 MHz): [ppm]=7.83 (m, 4H, spiro), 7.56 (dd, $^3J_{HH}$=8.1 Hz, $^4J_{HH}$=2.0 Hz, 2H, spiro), 7.18 (m, 8H, N-phenyl), 6.96 (m, 6H, N-phenyl, spiro), 6.88 (m, 10H, N-phenyl, spiro), 6.19 (d, $^4J_{HH}$=2.0 Hz, 2H, spiro).

To give a better overview, the monomers described in A6 are depicted below:

Part B: Preparation of the polymers

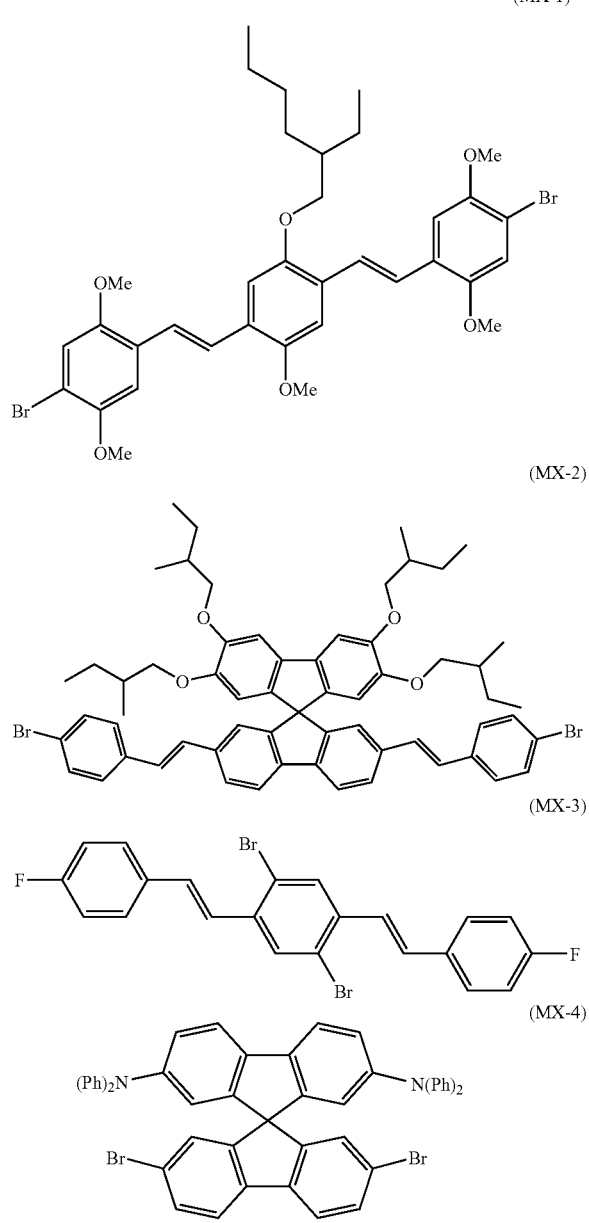

(MX-1)

(MX-2)

(MX-3)

(MX-4)

Copolymerization of 87.5 mol % of 2,7-dibromo-2', 3',6', 7'-tetra (2-methylbutyloxy)-spirobifluorene (S-SY1) and 12.5 mol % of N,N'-bis(4-bromo)phenyl-N,N'-bis(4-tert-butylphenyl)benzidine (AM1) by Yamamoto coupling (polymer P1)

1.53 g (5.57 mmol) of Ni(COD)$_2$ and 0.87 g (5.57 mmol) of 2,2'-bipyridyl were introduced under argon into a Schlenk vessel. 25 ml of dimethylformamide and 80 ml of toluene were added and the mixture was heated to 80° C. After 30 minutes, firstly 0.379 g (3.51 mmol, 0.43 ml) of 1,5-cyclooctadiene and then a solution of 1.768 g (2.11 mmol) of 2,7-dibromo-2',3',6',7'-tetra(2-methylbutyloxy)spirobifluorene (S-SY1) and 0.183 g (0.242 mmol) of N,N'-bis(4-bromophenyl)-N,N'-bis(4-tert-butylphenyl)-benzidine (AM1) in 20 ml of toluene were added. After 144 hours, the mixture was cooled, 5 ml of HCl in dioxane were added and the reaction mixture was stirred for 15 minutes. 50 ml of chloroform were added and the mixture was stirred for 15 minutes. The organic phase washed twice with 100 ml each time of 5M HCl and once with 100 ml of saturated NaHCO$_3$ solution. The solution was precipitated in 450 ml of methanol and the crude polymer was filtered off with suction. It was reprecipitated twice from 100 ml of THF/150 ml of methanol in each case. This gave 1.30 g (2.24 mmol, 83%) of fibrous, light-yellow polymer P1.

$^1$H NMR (CDCl$_3$): [ppm]=7.7-6.7 (m, 9.4H, spiro, TAD); 6.2-6.0 (m, 2H, spiro); 4.0-3.2 (2×m, 7.2H, OCH$_2$); 1.9-0.7 (m, alkyl H, including t-butyl at 1.30).

GPC: THF; 1 ml/min, Plgel 10 μm Mixed-B 2×300×7.5 mm$^2$, 35° C., RI detection: Mw=155 000 g/mol, Mn=53 000 g/mol Copolymerization of 50 mol % of the ethylene glycol ester of 2',3',6'7'-tetra(2-methylbutyloxy)spirobifluorene-2,7-bisboronic acid (S-SY2), 40 mol % of 2,7-dibromo-2',3',6',7'-tetra(2-methylbutyloxy)spirobifluorene (S-SY1) and 10 mol % of N,N'-bis(4-bromophenyl)-N,N'-bis(4-tert-butylphenyl) benzidine (AM1) by means of the Suzuki reaction (polymer P2).

8.0065 g (10.00 mmol) of the ethylene glycol ester of 2',3',6',7'-tetra(2-methylbutyloxy)spirobifluorene-2,7-bisboronic acid (S-SY2), 6.5499 g (8.00 mmol) of 2,7-dibromo-2', 3',6',7'-tetra(2-methylbutyloxy)spirobifluorene (S-SY1), 1.5173 g (2.00 mmol) of N,N'-bis(4-bromophenyl)-N,N'-bis(4-tert-butylphenyl)benzidine (AM1), 9.67 g (42 mmol) of K$_3$PO$_4$·H$_2$O, 30 ml of toluene, 15 ml of water and 0.25 ml of ethanol were degassed for 30 minutes by passing N$_2$ through the mixture. 175 mg (0.15 mmol) of Pd(PPh$_3$)$_4$ were subsequently added under protective gas. The suspension was stirred vigorously under a blanket of N$_2$ at an internal temperature of 87° C. (gentle reflux). After 4 days, a further 0.30 g of the ethylene glycol ester of 2',3',6',7'-tetra(2-methylbutyloxy)spirobifluorene-2,7-bisboronic acid was added. After heating for a further 6 hours, 0.3 ml of bromobenzene was added and the mixture was refluxed for another 3 hours.

The reaction solution was diluted with 200 ml of toluene and was then stirred with 200 ml of 2% strength aqueous NaCN solution for 3 hours. The mixture became virtually colorless during this time. The organic phase washed with H$_2$O and precipitated by dropwise addition to 800 ml of ethanol. The polymer was dissolved in 200 ml of THF at 40° C. over a period of 1 hour, precipitated with 250 ml of MeOH, washed and dried under reduced pressure. The solid was reprecipitated once more in 200 ml of THF/250 ml of methanol, filtered off with suction and dried to constant mass. This gave 12.25 g (18.8 mmol, 94%) of the polymer P2 as a light-yellow solid.

$^1$H NMR (CDCl$_3$): [ppm]=7.7-6.7 (m, 9.4H, spiro, TAD); 6.2-6.0 (m, 2H, spiro); 4.0-3.2 (2×m, 7.2H, OCH$_2$); 1.9-0.7 (m, alkyl H, including t-butyl at 1.30).

GPC: THF; 1 ml/min, PLgel 10 μm Mixed-B 2×300×7.5 mm$^2$, 35° C., RI detection: Mw=124 000 g/mol, Mn=39 000 g/mol.

Example P3 copolymerization of 50 mol % of the ethylene glycol ester of 2',3', 6',7'-tetra(2-methylbutyloxy)spirobifluorene-2,7-bisboronic acid (S-SY2), 30 mol % of 2,7-dibromo-2',3', 6',7'-tetra(2-methylbutyloxy)spirobifluorene (S-SY1), 10 mol % of 5,8-dibromodiphenylquinoxaline (CH-b) and 10 mol % of N,N'-bis(4-bromophenyl)-N,N'-bis(4-tert-butylphenyl)benzidine (AM1) by means of the Suzuki reaction (polymer P13).

4.9124 g (6.00 mmol) of the ethylene glycol ester of 2',3',6',7'-tetra(2-methylbutyloxy)spirobifluorene-2,7-bisboronic acid (S-SY2), 8.0065 g (10.00 mmol) of 2,7-dibromo-2',3',6',7'-tetra(2-methylbutyloxy)spirobifluorene (S-SY1), 0.8803 g (2.00) of 5,8-dibromodiphenylquinoxaline (CH-b), 1.5173 g (2.00 mmol) of N,N'-bis(4-bromophenyl)-N,N'-bis(4-tert-butylphenyl)benzidine (AM1), 9.67 g (42 mmol) of $K_3PO_4 \cdot H_2O$, 30 ml of toluene, 15 ml of water and 0.25 ml of ethanol were degassed for 30 minutes by passing $N_2$ through the mixture. 175 mg (0.15 mmol) of $Pd(PPh_3)_4$ were subsequently added under protective gas. The suspension was stirred vigorously under a blanket of $N_2$ at an internal temperature of 87° C. (gentle reflux). After 4 days, a further 0.30 g of the ethylene glycol ester of 2',3',6',7'-tetra(2-methylbutyloxy)spirobifluorene-2,7-bisboronic acid was added. After heating for a further 6 hours, 0.3 ml of bromobenzene was added and the mixture was refluxed for another 3 hours.

The reaction solution was diluted with 200 ml of toluene and stirred with 200 ml of 2% strength aqueous NaCN solution for 3 hours. The mixture became virtually colorless during this time. The organic phase washed with $H_2O$ and precipitated by adding it dropwise to 800 ml of ethanol. The polymer was dissolved in 200 ml of THF at 40° C. over a period of 1 hour, precipitated with 250 ml of MeOH, washed and dried under reduced pressure. The solid was reprecipitated once more in 200 ml of THF/250 ml of methanol, filtered off with suction and dried to constant mass. This gave 17.8 g (18.6 mmol, 93%) of the polymer P13 as a light-yellow solid.

$^1$H NMR (CDCl$_3$): [ppm]=7.8-6.7 (m, 9.6H, spiro, TAD); 6.4-6.0 (m, 2H, spiro); 4.0-3.4 (2×m, 6.4H, OCH$_2$); 1.9-0.7 (m, alkyl H, including t-butyl at 1.30).

GPC: THF; 1 ml/min, PLgel 10 μm Mixed-B 2×300×7.5 mm$^2$, 35° C., RI detection: Mw=54 000 g/mol, Mn=22 000 g/mol.

Example P4 Copolymerization of 50 mol % of the ethylene glycol ester of 2',3',6',7'-tetra(2-methylbutyloxy)spirobifluorene-2,7-bisboronic acid (S-SY2), 30 mol % of 2,7-dibromo-2',3',6',7'-tetra(2-methylbutyloxy)spirobifluorene (S-SY1), 10 mol % of N,N'-bis(4-bromophenyl)-N,N'-bis(4-tert-butylphenyl)benzidine (AM1) and 10 mol % of 2,3,6,7-tetra(2-methylbutyloxy)-2',7'-(4-bromostyryl)-9,9'-spirobifluorene (MX-2) by means of the Suzuki reaction (improved version) (polymer P35*).

Polymerization Method as Described in the Unpublished Patent Application DE 10159946.3:

16.0131 g (20.00 mmol) of the ethylene glycol ester of 2',3',6',7'-tetra(2-methylbutyloxy)spirobifluorene-2,7-bisboronic acid (S-SY2), 9.8249 g (12.00 mmol) of 2,7-dibromo-2',3',6',7'-tetra(2-methylbutyloxy)spirobifluorene (S-SY1), 3.0346 g (4.00 mmol) of N,N'-bis(4-bromophenyl)-N,N'-bis(4-tert-butylphenyl)benzidine (AM1), 4.0923 g (4.00 mmol) of 2,3,6,7-tetra(2-methylbutyloxy)-2',7'-(4-bromostyryl)-9,9'-spirobifluorene (MX-2), 19.57 g (85 mmol) of $K_3PO_4 \cdot H_2O$, 250 ml of toluene, 250 ml of dioxane, 40 ml of water were degassed for 30 minutes by passing argon through the mixture. A mixture of 2.25 mg (0.01 mmol) of PdAc$_2$ and 18.3 mg (0.06 mmol) of P(o-tolyl)$_3$ in 1 ml of toluene was subsequently added under protective gas. The suspension was stirred vigorously under a blanket of argon for about 5 hours under gentle reflux. During this time, the reaction mixture became viscous and displayed a bluish fluorescence. 118 mg (0.4 mmol) of 3,4-bis(2-methylbutyloxy)benzeneboronic acid in 150 ml of toluene were subsequently added and the mixture was refluxed for another one hour. Finally, 165 mg (0.5 mmol) of 3,4-bis(2-methylbutyloxy)bromobenzene in a further 100 ml were added and the mixture was refluxed for another one hour.

The reaction mixture was cooled, the aqueous phase was separated off and was subsequently stirred twice with 250 ml each time of a 5% strength sodium diethyldithiocarbamate solution in water at 60° C. It was subsequently stirred three times with 250 ml each time of water, diluted with 750 ml of THF and the crude polymer was finally precipitated by addition of 2 l of methanol. This was purified further by being reprecipitated twice from THF (1% strength solution) in methanol. Final purification was carried out by Soxhlet extraction with methanol/THF (1:1) for about 48 hours.

24.14 g (90%) of polymer were obtained as yellow fibers.

$^1$H NMR (CDCl$_3$): 7.8-6.2 (m, 12.6H, spiro, vinyl, TAD); 4.0-3.3 (2×m, 7.2H, OCH$_2$); 1.9-0.7 (m, 34.2H, alkyl H, including t-butyl at 1.25). GPC: THF; 1 ml/min, PLgel 10 μm Mixed-B 2×300×7.5 mm$^2$, 35° C., RI detection: Mw=830 000 g/mol, Mn=220 000 g/mol.

This polymer had a higher molecular weight than the polymer P35 listed in the table (see below), which had been prepared by the old polymerization method.

This also enabled a few property changes to be achieved; some further data:

Viscosity data: solution (P35*) in anisole/o-xylene (14 g/l): 20.8 mPas (@ 40 s$^{-1}$); solution (P35*) in tetralin (8 g/l): 15.8 mPas (@ 40 s$^{-1}$).

EL data: max. eff.: 5.35 Cd/A; 3.8 V@ 100 Cd/m$^2$; color: light blue (CIE-1931: x/y=0.18, 0.25); operating life (@100 Cd/m$^2$): 4000 h.

Further polymers were prepared by methods analogous to those described for P1, P2 and P13. The chemical properties are summarized in the following table. All these polymers were also examined for use in PLEDs. The way in which PLEDs can be produced has been indicated above and is described in more detail in part C. The most important device properties (color, efficiency and life) are also listed in the table.

| Polymer | Proportion of the monomers in the polymerization [%] | | | | GPC** | | | Electroluminescence*** | | | Life at | Visco.**** |
| | | | | | $M_W$ (1000 g/mol) | $M_N$ (1000 g/mol) | $\lambda_{max}$ [nm] | Max. eff [Cd/A] | Voltage at 100 Cd/m$^2$ [V] | EL color | 100 Cd/m$^2$ [h] | Gel temp. [° C.] |
| (Type)* | Monom. 1 | Monom. 2 | Monom. 3 | Monom. 4 | | | | | | | | |
| P1 (Y) | 87.5% S-SY1 | 12.5% AM1 | | | 155 | 53 | 465 | 2.7 | 4.0 | blue | 800 | <0° C. |
| P2 (S) | 50% S-SY2 | 40% S-SY1 | 10% AM1 | | 124 | 39 | 463 | 2.8 | 4.5 | blue | 1250 | <0° C. |
| P3 (S) | 50% S-SY2 | 40% S-US1 | 10% AM1 | | 101 | 41 | 465 | 2.6 | 4.5 | blue | 1150 | <0° C. |

-continued

| Polymer (Type)* | Proportion of the monomers in the polymerization [%] | | | | GPC** $M_W$ (1000 g/mol) | $M_N$ (1000 g/mol) | Electroluminescence*** $\lambda_{max}$ [nm] | Max. eff [Cd/A] | Voltage at 100 Cd/m² [V] | EL color | Life at 100 Cd/m² [h] | Visco.**** Gel temp. [° C.] |
|---|---|---|---|---|---|---|---|---|---|---|---|---|
| | Monom. 1 | Monom. 2 | Monom. 3 | Monom. 4 | | | | | | | | |
| P4 (S) | 50% S-SY2 | 40% S-US2 | 10% AM1 | | 90 | 40 | 470 | 3.0 | 4.7 | blue | 1550 | 10° C. |
| P5 (S) | 50% S-SY2 | 40% S-US3 | 10% AM1 | | 115 | 45 | 473 | 3.2 | 4.2 | blue | 2250 | <0° C. |
| P6 (S) | 50% S-SY2 | 40% S-US4 | 10% AM1 | | 87 | 36 | 472 | 2.8 | 4.5 | blue | 1250 | <0° C. |
| P7 (S) | 50% S-SY2 | 40% S-SY3 | 10% AM1 | | 120 | 46 | 467 | 1.9 | 5.1 | blue | 610 | 10° C. |
| P8 (S) | 50% S-SY4 | 40% S-SY1 | 10% AM1 | | 110 | 38 | 468 | 1.8 | 5.3 | blue | 410 | 15° C. |
| P9 (S) | 50% S-SY2 | 40% S-SY1 | 10% AM2 | | 89 | 30 | 470 | 2.2 | 5.0 | blue | 900 | <0° C. |
| P10 (S) | 50% S-SY2 | 40% S-SY1 | 10% AM3 | | 83 | 29 | 465 | 1.6 | 5.6 | blue | 800 | <0° C. |
| P11 (S) | 50% S-SY2 | 40% S-SY1 | 10% AM1 | | 124 | 39 | 463 | 2.8 | 4.5 | blue | 1250 | <0° C. |
| P12 (S) | 50% S-SY2 | 30% S-SY1 | 10% AM1 | 10% CH-a | 98 | 48 | 509 | 6.8 | 5.8 | green | 3000 | <0° C. |
| P13 (S) | 50% S-SY2 | 30% S-SY1 | 10% AM1 | 10% CH-b | 77 | 32 | 516 | 7.6 | 4.6 | green | 4300 | <0° C. |
| P14 (S) | 50% S-SY2 | 30% S-SY1 | 10% AM1 | 10% CH-c | 99 | 29 | 516 | 5.9 | 5.8 | green | 2800 | <0° C. |
| P15 (S) | 50% S-SY2 | 30% S-SY1 | 10% AM1 | 10% CH-d | 110 | 51 | 545 | 6.9 | 4.7 | green-yellow | 4000 | <0° C. |
| P16 (S) | 50% S-SY2 | 30% S-SY1 | 10% AM1 | 10% CH-e | 105 | 37 | 527 | 7.7 | 3.9 | green | >5000 | <0° C. |
| P17 (S) | 50% S-SY2 | 30% S-SY1 | 10% AM1 | 10% CH-f | 120 | 48 | 525 | 6.0 | 4.9 | green | 2100 | <0° C. |
| P18 (S) | 50% S-SY2 | 30% S-SY1 | 10% AM1 | 10% CH-g | 29 | 10 | 525 | 3.1 | 7.1# | green | — | ~20° C. |
| P19 (S) | 50% S-SY2 | 30% S-SY1 | 10% AM1 | 10% CH-h | 91 | 29 | 535 | 6.7 | 3.8 | green | >5000 | <0° C. |
| P20 (S) | 50% S-SY2 | 30% S-SY1 | 20% CH-h | | 87 | 36 | 534 | 6.1 | 4.1 | green | 4000 | <0° C. |
| P21 (S) | 50% S-SY2 | 30% S-SY1 | 10% AM1 | 10% CH-i | 124 | 63 | 553 | 6.5 | 4.8 | green-yellow | 2500 | <0° C. |
| P22 (S) | 50% S-SY2 | 30% S-SY1 | 10% AM1 | 10% CH-k | 54 | 20 | 541 | 2.2 | 5.8 | green-yellow | — | ~5° C. |
| P23 (S) | 50% S-SY2 | 30% S-SY1 | 10% AM1 | 10% CH-l | 111 | 54 | 524 | 5.9 | 5.1 | green | 1800 | <0° C. |
| P24 (S) | 50% S-SY2 | 20% S-SY1 | 20% MX-4 | 10% CH-b | 138 | 56 | 516 | 8.8 | 3.8 | green | >5000 | <0° C. |
| P25 (S) | 50% S-SY2 | 30% S-SY1 | 10% AM1 | 10% N2S-1 | 98 | 37 | 551 | 7.1 | 4.9 | green-yellow | 1600 | <0° C. |
| P26 (S) | 50% S-SY2 | 30% S-SY1 | 10% AM1 | 10% N2O-1 | 87 | 39 | 575 | 6.2 | 5.4 | yellow | 1200 | <0° C. |
| P27 (S) | 50% S-SY2 | 10% AM1 | 35% N2S-1 | 5%(N2S-1)-T2-Br2 | 89 | 40 | 632 | 1.5 | 3.6 | red | >5000 | <0° C. |
| P28 (S) | 50% S-SY2 | 10% AM1 | 35% N2S-1 | 5%(N2S-1)-T1-Br2 | 112 | 45 | 597 | 1.6 | 4.9 | red-orange | >5000 | <0° C. |
| P29 (S) | 50% S-SY2 | 10% AM1 | 35% N2S-1 | 5%(CH-b)-T2-Br2 | 56 | 20 | 619 | 1.5 | 3.5 | red | >5000 | <0° C. |
| P30 (S) | 50% S-SY2 | 10% AM1 | 35% N2S-1 | 5%(CH-b)-T1-Br2 | 89 | 45 | 590 | 1.9 | 3.9 | red-orange | >5000 | <0° C. |
| P31 (S) | 50% S-SY2 | 10% AM1 | 35% N2S-1 | 5%(5)-T2-Br2 | 120 | 62 | 560 | 3.2 | 4.9 | yellow-orange | — | <0° C. |
| P32 (S) | 50% S-SY2 | 10% AM1 | 35% N2S-1 | 5%(6)-T2-Br2 | 79 | 30 | 575 | 1.0 | 6.9 | yellow-orange | — | <0° C. |
| P33 (S) | 50% S-SY2 | 10% MX-1 | 35% N2S-1 | 5%(N2S-1)-T2-Br2 | 117 | 48 | 642 | 1.9 | 3.0 | red | >5000 | <0° C. |
| P34 (S) | 50% S-SY2 | 30% S-SY1 | 10% AM1 | 10% MX-1 | 135 | 53 | 520 | 9.8 | 3.5 | green | >5000 | <0° C. |
| P35 (S) | 50% S-SY2 | 30% S-SY1 | 10% AM1 | 10% MX-2 | 102 | 45 | 475 | 4.0 | 4.2 | blue-green | 2100 | <0° C. |
| P36 (S) | 50% S-SY2 | 30% S-SY1 | 10% AM1 | 10% MX-3 | 65 | 25 | 460 | 2.0 | 4.4 | blue | 1200 | <0° C. |
| P37 (S) | 50% S-SY2 | 30% S-SY1 | 10% AM1 | 10% MX-4 | 128 | 60 | 468 | 3.2 | 4.0 | blue | 2000 | <0° C. |
| P38 (S) | 50% S-SY2 | 20% S-SY1 | 10% AM1 | 20% MX-4 | 99 | 39 | 468 | 3.2 | 3.8 | blue | 1900 | <0° C. |
| P39 (Y) | 80% S-SY1 | 10% AM1 | 10% MX-4 | | 176 | 76 | 466 | 3.3 | 4.0 | blue | 2500 | <0° C. |
| P40 (S) | 50% S-SY2 | 20% S-SY1 | 10% AM1 | 10% MX-4 10% CH-b | 112 | 60 | 517 | 10.2 | 3.0 | green | >5000 | <0° C. |
| P41 (S) | 50% S-SY2 | 20% S-SY1 | 10% AM1 | 10% MX-1 10% CH-b | 122 | 62 | 515 | 11.2 | 2.9 | green | >5000 | <0° C. |
| V1 (S) | 50% S-SY2 | 50% S-SY1 | | | 142 | 62 | 451 | 0.1 | 8.9 | blue | — | <0° C. |
| V2 (S) | 50% S-SY2 | 40% S-SY1 | 10% MX-1 | | 102 | 60 | 518 | 2.1 | 9.3 | green | 100 h | <0° C. |
| V3 (S) | 50% S-SY2 | 25% S-SY1 | 25% MX-1 | | 99 | 38 | 523 | 2.0 | 9.2 | green | 80 h | <0° C. |

*S = Prepared by Suzuki polymerization (cf. Ex. P2), Y = prepared by Yamamoto polymerization (cf. Ex. P1)
**GPC measurements in THF; 1 ml/min, Plgel 10 μm Mixed-B 2 × 300 × 7.5 mm², 35° C., RI detection was calibrated against polystyrene
***For preparation of the polymeric LEDs, see part C
****Solutions of the polymer (10 mg/ml) in toluene were heated to 60° C., cooled at 1° C./minute and the viscosity was measured on a Brookfield LVDV-III rheometer (CP-41). At the gel temperature determined in this way, a sharp increase in the viscosity occurred.
Owing to the poor solubilily, the PLEDs were produced from chlorobenzene.

Part C: Production and Characterization of LEDs:

LEDs were produced by the general method outlined below. This naturally had to be adapted in each individual case to the particular circumstances (e.g. polymer viscosity and optimal layer thickness of the polymer in the device). The LEDs described below were in each case two-layer systems, i.e. substrate//ITO//PEDOT//polymer//cathode. PEDOT is a polythiophene derivative which can, for example, be procured from BAYER AG as Baytron P™

General Method of Producing Highly Efficient, Long-Life. LEDs:

After the ITO-coated substrates (e.g. glass support, PET film) have been cut to the correct size, they are cleaned in a number of cleaning steps in an ultrasonic bath (e.g. soap solution, Millipore water, isopropanol).

They are dried by blowing with an $N_2$ gun and stored in a desiccator. Before coating with the polymer, they are treated in an ozone plasma apparatus for about 20 minutes. A solution of the respective polymer (generally with a concentration of 4-25 mg/ml in, for example, toluene, chlorobenzene, xylene: cyclohexanone (4:1)) is made up and dissolved by stirring at room temperature. Depending on the polymer, it can also be advantageous to stir at 50-70° C. for some time. When the polymer has dissolved completely, the solution is filtered through a 5 μm filter and applied by means of a spin coater at varying speeds (400-6000). The layer thicknesses can in this way be varied in a range from about 50 to 300 nm. The measurements are carried out using a Dektak instrument as described in EP 1029019. A conductive polymer, preferably doped PEDOT or PANI, is usually applied to the (structured) ITO beforehand.

Electrodes are then applied to the polymer films. This is generally carried out by thermal vapor deposition (Balzer BA360 or Pfeiffer PL S 500). The transparent ITO electrode is then connected as anode and the metal electrode (e.g. Ba, Yb, Ca) is connected as cathode and the device parameters are determined.

The results obtained using the polymers described are summarized in the table in part B.

The invention claimed is:

1. A monomer having the formula (I)

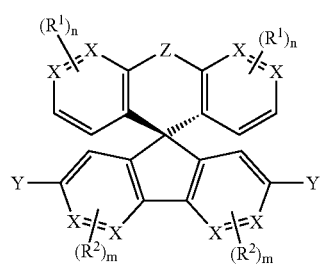

wherein

X is, identically or differently on each occurrence, CH, $CR^1$, or N;

Z is, identically or differently on each occurrence, a single chemical bond, a $CR^3R^4$ group, a —$CR^3R^4$—$CR^3R^4$— group, a —$CR^3$=$CR^4$— group, O, S, N—$R^5$, C=O, C=$CR^3R^4$ or $SiR^3R^4$;

$R^1$ is, identically or differently on each occurrence, $N(R^5)_2$ or $N(R^5)_3^+$;

$R^2$ is, identically or differently on each occurrence, a linear, branched, or cyclic alkyl or alkoxy chain having up to 22 carbon atoms wherein one or more nonadjacent carbon atoms is optionally replaced by N—$R^5$, O, S, —CO— O—, or O—CO—O, and wherein one or more H atoms is optionally replaced by fluorine; or is an aryl or aryloxy group having from 5 to 40 carbon atoms and is optionally substituted by one or more nonaromatic radicals $R^1$, wherein one or more carbon atoms is optionally replaced by O, S, or N which is; or is CN;

$R^3$ and $R^4$ are, identically or differently on each occurrence, is H; a linear, branched, or cyclic alkyl chain having up to 22 carbon atoms wherein one or more nonadjacent carbon atoms is optionally replaced by N—$R^5$, O, S, —CO— O—, or O—CO—O, and wherein one or more H atoms is optionally replaced by fluorine, or are each an aryl group having from 5 to 40 carbon atoms and is optionally substituted by one or more nonaromatic radicals $R^1$, wherein one or more carbon atoms is optionally replaced by O, S, or N; or are each CN; and wherein a plurality of $R^3$ and/or $R^4$ optionally define a ring;

$R^5$ is, identically or differently on each occurrence, H; a linear, branched, or cyclic alkyl chain having up to 22 carbon atoms wherein one or more nonadjacent carbon atoms optionally replaced by O, S, —CO—O—, or O—CO—O, and wherein one or more H atoms is optionally replaced by fluorine; or is an aryl group having from 5 to 40 carbon atoms optionally substituted by one or more nonaromatic radicals $R^1$, wherein or more carbon atoms is optionally replaced by O, S, or N;

m is, identically or differently on each occurrence, 0, 1, 2, or 3;

n is, identically or differently on each occurrence, 0, 1, 2, 3, or 4; and

Y is, identically or differently on each occurence, bromine and/or boronic acid ester.

2. The monomer of claim 1, wherein $R^5$ is an aryl group having 5 to 40 carbon atoms optionally substituted by one or more nonaromatic radicals $R^1$, wherein one or more carbon atoms is optionally replaced by O, S, or N.

3. The monomer of claim 1, wherein $R^5$ is a phenyl group.

4. The monomer of claim 1, wherein m is 0.

5. The monomer of claim 1, wherein n is 1 or 2.

6. The monomer of claim 1, wherein X is CH.

7. The monomer of claim 1, wherein Z is a single bond.

* * * * *